United States Patent
Agazzi et al.

(10) Patent No.: US 6,289,047 B1
(45) Date of Patent: *Sep. 11, 2001

(54) DYNAMIC REGULATION OF POWER CONSUMPTION OF A HIGH-SPEED COMMUNICATION SYSTEM

(75) Inventors: Oscar E. Agazzi, Irvine; John L. Creigh, Rancho Santa Margarita; Mehdi Hatamian, Mission Viejo; Henry Samueli, San Juan Capistrano, all of CA (US)

(73) Assignee: Broadcom Corporation, Irvine, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/390,856

(22) Filed: Sep. 3, 1999

Related U.S. Application Data

(63) Continuation-in-part of application No. 09/143,476, filed on Aug. 28, 1998.
(60) Provisional application No. 60/108,319, filed on Nov. 13, 1998, provisional application No. 60/130,616, filed on Apr. 22, 1999, and provisional application No. 60/107,880, filed on Nov. 9, 1998.

(51) Int. Cl.[7] ..................................................... H03H 7/30
(52) U.S. Cl. ......................... 375/232; 375/220; 375/229; 375/285; 370/290
(58) Field of Search ................................. 375/232, 350, 375/233, 340, 377, 220, 229, 285; 370/290; 381/94.7

(56) References Cited

U.S. PATENT DOCUMENTS

| 5,307,405 | 4/1994 | Sih | 379/410 |
|---|---|---|---|
| 5,388,092 | 2/1995 | Koyama et al. | 370/32.1 |
| 5,406,613 | * 4/1995 | Peponides et al. | 455/574 |

(List continued on next page.)

FOREIGN PATENT DOCUMENTS

WO 99/46867 * 3/1999 (WO) .............................. H04B/3/20

OTHER PUBLICATIONS

Nicol et al., A Low–Power 128–Tap Digital Adaptive Equalizer for Broadband Modem, IEEE, Vo.32, No. 11, pp. 1777–1789, Nov. 1997.*

IEEE Std 802.3ab–1999 (Supplement to IEEE Std 802.3, 1998 Edition), entitled Supplement to Carrier Sense Multiple Access with Collision Detection (CSMA/CD) Access Method and Physical Layer Specificiations—Physical Layer Parameters and Specifications for 1000 Mb/s Operation Over 4–Pair of Category 5 Balanced Copper Cabling, Type 1000BASE–T.

*Primary Examiner*—Stephen Chin
*Assistant Examiner*—Shuwang Liu
(74) *Attorney, Agent, or Firm*—Christie, Parker & Hale, LLP

(57) ABSTRACT

A method for dynamically regulating the power consumption of a high-speed integrated circuit which includes a multiplicity of processing blocks. A first metric and a second metric, which are respectively related to a first performance parameter and a second performance parameter of the integrated circuit, are defined. The first metric is set at a pre-defined value. Selected blocks of the multiplicity of processing blocks are disabled in accordance with a set of pre-determined patterns. The second metric is evaluated, while the disabling operation is being performed, to generate a range of values of the second metric. Each of the values corresponds to the pre-defined value of the first metric. A most desirable value of the second metric is determined from the range of values and is matched to a corresponding pre-determined pattern. The integrated circuit is subsequently operated with selected processing blocks disabled in accordance with the matching pre-determined pattern.

6 Claims, 16 Drawing Sheets

U.S. PATENT DOCUMENTS

| | | | | |
|---|---|---|---|---|
| 5,455,819 | * | 10/1995 | Sugiyama | 370/13 |
| 5,517,435 | * | 5/1996 | Sugiyama | 364/724.19 |
| 5,526,347 | | 6/1996 | Chen et al. | 370/32.1 |
| 5,539,773 | | 7/1996 | Knee et al. | 375/232 |
| 5,617,450 | * | 4/1997 | Kakuishi et al. | 375/230 |
| 5,659,609 | | 8/1997 | Koizumi et al. | 379/410 |
| 5,745,564 | * | 4/1998 | Meek | 379/410 |
| 5,796,725 | * | 8/1998 | Muraoka | 370/290 |
| 5,867,486 | * | 2/1999 | Sugiyama | 370/290 |
| 5,933,495 | * | 8/1999 | Oh | 379/420 |
| 5,946,349 | * | 8/1999 | Raghunath | 375/232 |

* cited by examiner

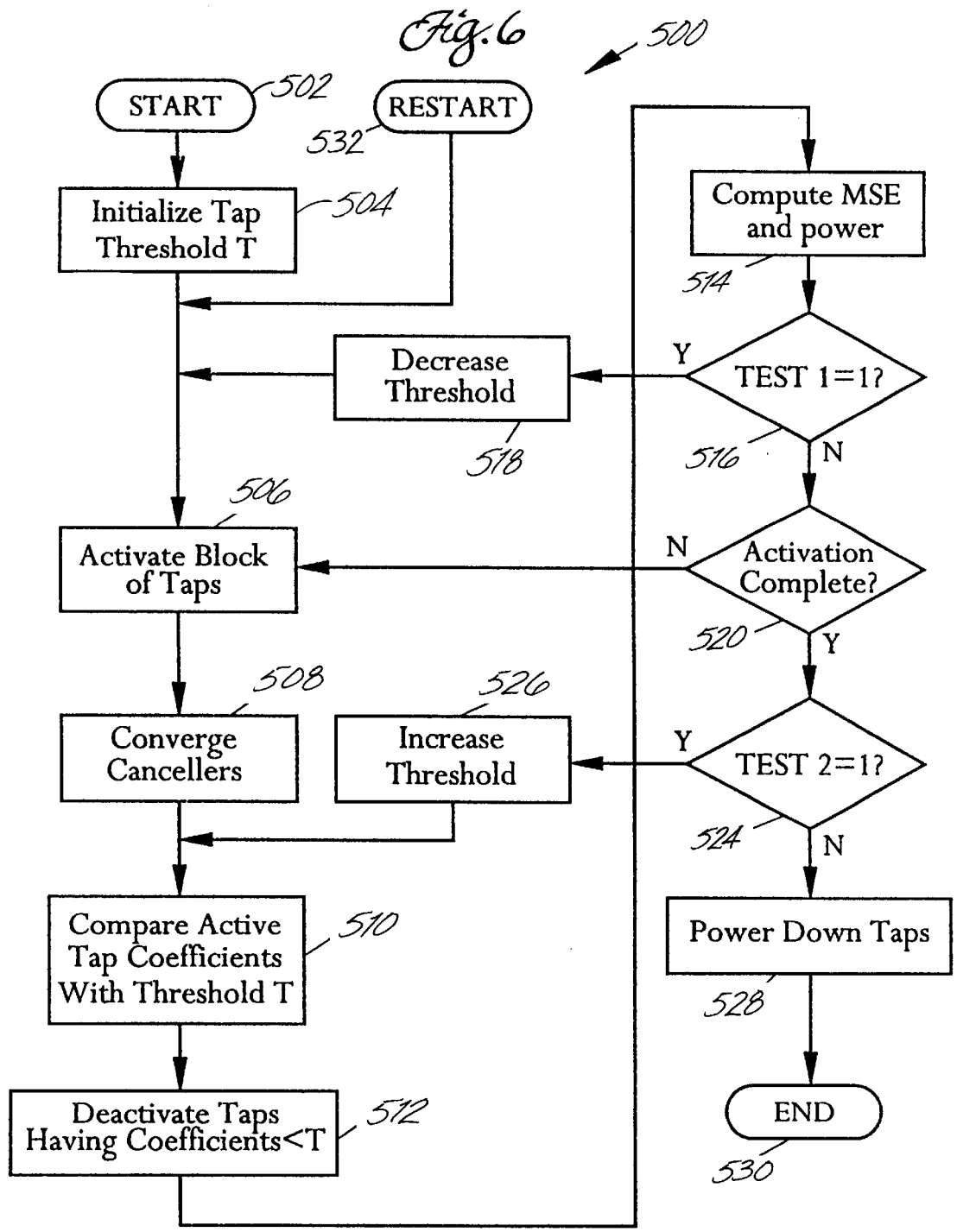

DYNAMIC REGULATION OF POWER CONSUMPTION OF A HIGH-SPEED COMMUNICATION SYSTEM

PRIORITY CLAIMS

The present application is a continuation-in-part of U.S. patent application Ser. No. 09/143,476 entitled "Apparatus for, and Method of, Reducing Power Dissipation in a Communications System" filed on Aug. 28, 1998. The present application also claims priority on the basis of the following provisional applications: Ser. No. 60/108,319 entitled "Gigabit Ethernet Transceiver" filed on Nov. 13, 1998, and Ser. No. 60/130,616 entitled "Multi-Pair Gigabit Ethernet Transceiver" filed on Apr. 22, 1999, and Ser. No. 60/107/880 entitled "APPARATUS FOR, AND METHOD OF, REDUCING POWER DISSIPATION IN A COMMUNICATION S SYSTEM" filed on Nov. 9, 1998.

FIELD OF THE INVENTION

The present invention relates generally to methods and systems for regulating the power consumption of a communication system. More particularly, the invention relates to a method and a system for dynamically balancing power consumption against system performance requirements in a high-speed communication system operating at gigabit rates.

BACKGROUND OF THE INVENTION

Local Area Networks (LAN) provides network connectivity for personal computers, workstations and servers. Ethernet, in its original 10BASE-T form, remains the dominant network technology for LANs. However, among the high speed LAN technologies available today, Fast Ethernet, or 100BASE-T, has become the leading choice. Fast Ethernet technology provides a smooth, nondisruptive evolution from the 10 megabits per second (Mbps) performance of the 10BASE-T to the 100 Mbps performance of the 100BASE-T. The growing use of 100BASE-T connections to servers and desktops is creating a definite need for an even higher speed network technology at the backbone and server level.

The most appropriate solution to this need, now in development, is Gigabit Ethernet. Gigabit Ethernet will provide 1 gigabit per second (Gbps) bandwidth with the simplicity of Ethernet at lower cost than other technologies of comparable speed, and will offer a smooth upgrade path for current Ethernet installations.

In a Gigabit Ethernet communication system that conforms to the 1000BASE-T standard, gigabit transceivers are connected via Category 5 twisted pairs of copper cables. Cable responses vary drastically among different cables. Thus, the computations, and hence power comsumption, required to compensate for noise (such as echo, near-end crosstalk, far-end crosstalk) will vary widely depending on the particular cable that is used.

In integrated circuit technology, power consumption is generally recognized as being a function of the switching (clock) speed of transistor elements making up the circuitry, as well as the number of component elements operating within a given time period. The more transistor elements operating at one time, and the higher the operational speed of the component circuitry, the higher the relative degree of power consumption for that circuit. This is particularly relevant in the case of Gigabit Ethernet, since all computational circuits are clocked at 125 Mhz (corresponding to 250 Mbps per twisted pair of cable), and the processing requirements of such circuits require rather large blocks of computational circuitry, particularly in the filter elements. Power consumption figures in the range of from about 4.5 Watts to about 6.0 Watts are not unreasonable when the speed and complexity of modern gigabit communication circuitry is considered.

Pertinent to an analysis of power consumption is the realization that power is dissipated, in integrated circuits, as heat. As power consumption increases, not only must the system be provided with a more robust power supply, but also with enhanced heat dissipation schemes, such as heat sinks (dissipation fins coupled to the IC package), cooling fans, increased interior volume for enhanced air flow, and the like. All of these dissipation schemes involve considerable additional manufacturing costs and an extended design cycle due to the need to plan for thermal considerations.

Prior high speed communication circuits have not adequately addressed these thermal considerations, because of the primary necessity of accommodating high data rates with a suficient level of signal quality. Prior devices have, in effect, "hard wired" their processing capability, such that processing circuitry is always operative to maximize signal quality, whether that degree of processing is required or not. Where channel quality is high, full-filter-tap signal processing more often obeys the law of diminishing returns, with very small incremental noise margin gains recovered from the use of additional large blocks of active filter circuitry.

This trade-off between power consumption and signal quality has heretofore limited the options available to an integrated circuit communication system designer. If low power consumption is made a system requirement, the system typically exhibits poor noise margin or bit-error-rate performance. Conversely, if system performance is made the primary requirement, power consumption must fall where it may with the corresponding consequences to system cost and reliability.

Accordingly, there is a need for a high speed integrated circuit communication system design which is able to accomodate a wide variety of worst-case channel (cable) responses, while adaptively evaluating signal quality metrics in order that processing circuitry might be disabled, and power consumption might thereby be reduced, at any such time that the circuitry is not necessary to assure a given minimum level of signal quality.

Such a system should be able to adaptively determine and achieve the highest level of signal quality consistent with a given maximum power consumption specification. In addition, such a system should be able to adaptively determine and achieve the lowest level of power consumption consistent with a given minimum signal quality specification.

SUMMARY OF THE INVENTION

The present invention is a method for dynamically regulating the power consumption of a high-speed integrated circuit which includes a multiplicity of processing blocks. A first metric and a second metric, which are respectively related to a first performance parameter and a second performance parameter of the integrated circuit, are defined. The first metric is set at a pre-defined value. Selected blocks of the multiplicity of processing blocks are disabled in accordance with a set of pre-determined patterns. The second metric is evaluated, while the disabling operation is being performed, to generate a range of values of the second metric. Each of the values corresponds to the pre-defined value of the first metric. A most desirable value of the second metric is determined from the range of values and is matched to a corresponding pre-determined pattern. The integrated circuit is subsequently operated with selected processing blocks disabled in accordance with the matching pre-determined pattern.

In particular, the first and second performance parameters are distinct and are chosen from the parametric group consisting of power consumption and a signal quality figure of merit. The signal quality figure of merit is evaluated while selected blocks of the multiplicity of processing blocks are disabled. The set of selected blocks which give the lowest power consumption, when disabled, while at the same time maintaining an acceptable signal quality figure of merit at a pre-defined threshold level is maintained in a disabled condition while the integrated circuit is subsequently operated.

In one aspect of the present invention, reduced power dissipation is chosen as the most desirable metric to evaluate, while a signal quality figure of merit is accorded secondary consideration. Alternatively, a signal quality figure of merit is chosen as the most desirable metric to evaluate, while power dissipation is accorded a secondary consideration. In a further aspect of the present invention, both signal quality and power dissipation are accorded equal consideration with selective blocks of the multiplicity of processing blocks being disabled and the resultant signal quality and power dissipation figures of merit being evaluated so as to define a co-existing local maxima of signal quality with a local minima of power dissipation.

In one particular embodiment, the present invention may be characterized as a method for dynamically regulating the power consumption of a communication system which includes at least a first module. The first module can be any circuit block, not necessarily a signal processing block. Power regulation proceeds by specifying a power dissipation value and an error value. An information error metric and a power metric is computed. Activation and deactivation of at least a portion of the first module of the communication system is controlled according to a particular criterion. The criterion is based on at least one of the information error metric, the power metric, the specified error and the specified power, to regulate at least one of the information metric and the power metric.

In particular, at least a portion of the first module is activated if the information error metric is greater than the specified error and the first module portion is deactivated if the information error metric is less than the specified error. In an additional aspect of the invention, the first module portion is activated if the information error metric is greater than the specified error and the power metric is smaller than the specified power. The first module portion is deactivated if the information error metric is smaller than the specified error or the power metric is greater than the specified power. In yet a further aspect of the invention, the first module portion is activated if the information error metric is greater than the specified error and is deactivated if the information error metric is smaller than a target value, the target value being smaller than the specified error. In yet another aspect of the invention, the first module portion is activated if the information error metric is greater than the specified error and the power metric is smaller than the specified power. The first module portion is deactivated if the information error metric is smaller than a target value, the target value being smaller than the specified error, or the power metric is greater than the specified power.

Advantageously, the information error metric is related to a bit error rate of the communication system and the information error metric is a measure of performance degradation in the communication system caused by deactivation of the portion of the first module. Where the module is a filter which includes a set of taps, with each of the taps including a filter coefficient, the information error metric is a measure of performance degradation of a transceiver caused by operation of the filter.

Power dissipation reduction is implemented by deactivating subsets of taps which make up the filter, until such time as performance degradation caused by the truncated filter reaches a pre-determined threshold level.

DESCRIPTION OF THE DRAWINGS

These and other features, aspects and advantages of the present invention will be more fully understood when considered with respect to the following detailed description, appended claims and accompanying drawings, wherein:

FIG. 6 is a flowchart depicting a first exemplary embodiment of an adaptive power reduction method according to the present invention;

DETAILED DESCRIPTION OF THE INVENTION

In the context of an exemplary integrated circuit-type bidirectional communication system, the present invention might be characterized as a system and method for adaptively and dynamically regulating the power consumption of an integrated circuit communication system as a function of particular, user defined signal quality metrics. Signal quality metrics might include a signal's bit error rate (BER), a signal-to-noise ratio (SNR) specification, noise margin figure, dynamic range, or the like. Indeed, signal quality is a generalized term used to describe a signal's functional fidelity.

As will be understood by one having skill in the art, signal quality is a measurable operational characteristic of various component portions of modern communication systems. Various forms of signal quality metrics are used to define the features and functionality of signal processing portions of integrated circuit communication devices, particularly coder/decoder circuitry, equalizers and filters, each of which require large amounts of silicon real estate for effective implementation, and a consequently large degree of power consumption during operation.

Figure 1:
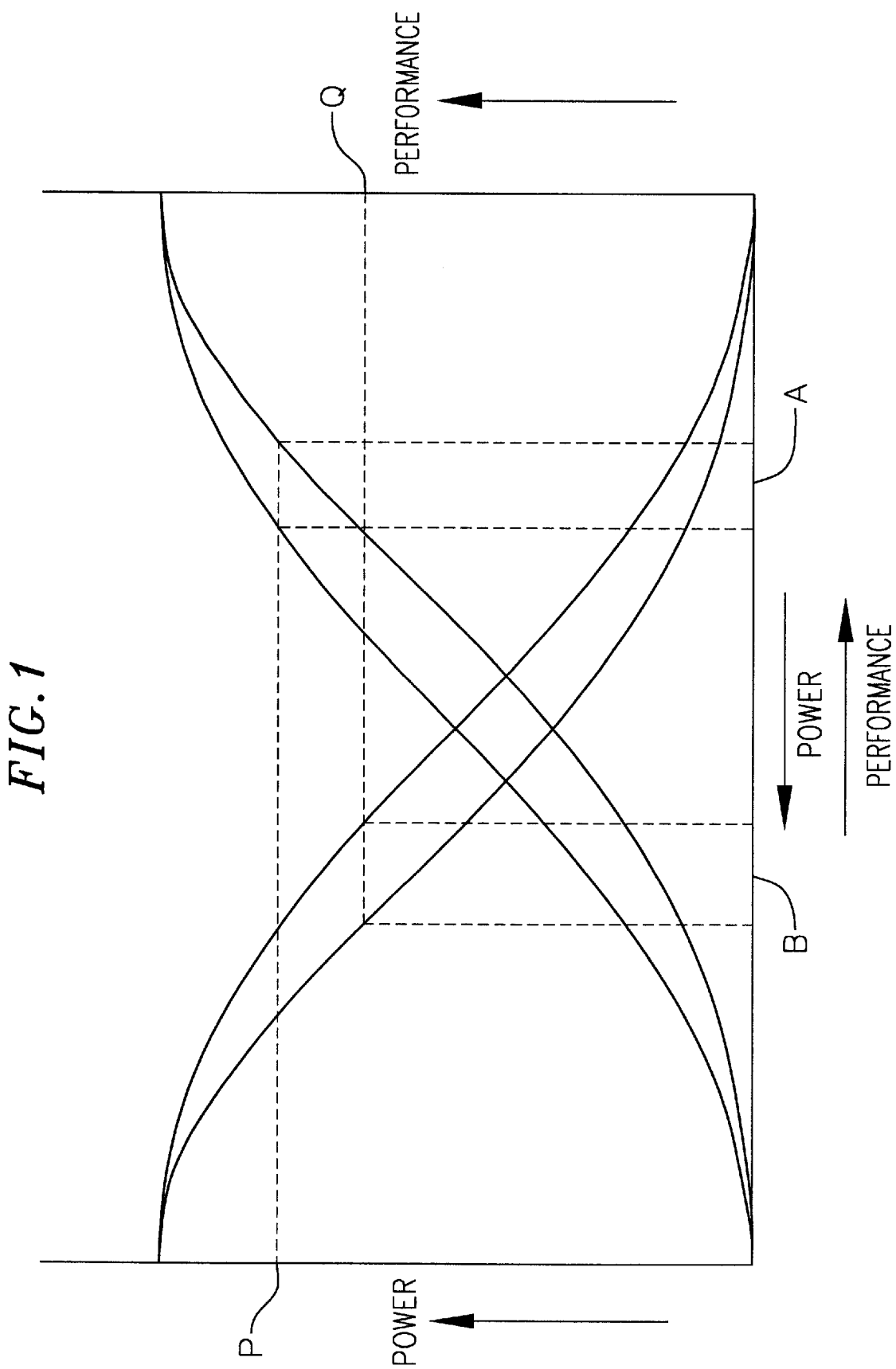
FIG. 1 is a simplified matrix diagram illustrating the relationship between power consumption and a performance metric.

Turning now to FIG. 1, the invention might be described briefly as a methodology for balancing the conflicting circuit performance requirements represented by signal quality and power consumption and might be illustrated as the implementation of a decision matrix having power consumption as one of the dimensions and a chosen signal quality metric as another. From FIG. 1, it will be understood that integrated circuit power consumption is directly related to processed signal quality. This is particularly true in the case of integrated circuits incorporating high order digital filter elements, having a large number of taps, all of which consume power when in operation.

However, it has been generally accepted integrated circuit design practice to construct an integrated circuit communication device to accommodate the most stringent digital processing that might be required by a device in an actual application. In the case of an Ethernet transceiver, for example, provision must be made for processing signals transmitted over a wide variety of transmission channels exhibiting widely disparate transmission channel characteristics, ranging from extremely lossy, highly populated, long wiring run channels, to very short (<2 meters) point-to-point installations. In either case, all of the signal processing elements of conventional transceiver circuitry are operative to process a signal, whether needed or not, such that power consumption is relatively constant and large.

In FIG. 1, the evaluation matrix judges an output signal quality metric against a threshold standard, and where a measured quality metric is greater than the threshold, allows the power consumption of the device to be reduced by turning off various functional processing blocks until the output signal quality is reduced to the threshold value. This aproach has particular utility in the case of digital filter elements, coder/decoder circuitry and equalizers, all of which include multiple elements that are required for processing signals propagated through harsh channel environments, but to various degrees unnecessary when signals are propagated through a more benign channel.

The evaluation matrix, as exemplified in FIG. 1, might be initialized by a user input requirement, such as the degree to which power consumption is an issue. A particular power consumption value might be set as an operational parameter (indicated as "P" in FIG. 1), and portions of the device adaptively turned off until the desired power value is reached. This will necessarily affect the signal quality of a signal processed by such truncated circuitry, but, in accordance with the invention, signal quality is able to be locally maximized to a pre-determined power consumption metric, such that device performance is not unduly sacrificed.

Various portions of the device might be powered-down in predetermined sequential combinations with each combination resulting in a particular performance metric. Signal performance is evaluated at each sequential step. Thus, any one power consumption specification ,i.e. "P", will give a range of performance values (represented as "A" in FIG. 1). The best signal performance result is necessarily the chosen metric for deciding which of the multiplicity of power-down configurations is implemented. Consequently, where power is the primary concern, signal quality defaults to the best signal performance achievable at the specified power level.

Where signal quality (performance) is the primary concern, the system is allowed to function normally, with all processing blocks operative. In this circumstance, power consumption will be expected to be nominal.

Where signal quality is desirable, but some accommodation must be made to power consumption, a user may set a signal quality metric as a threshold standard (indicated as "Q" in FIG. 1), and allow the system to adaptively and dynamically run through a multiplicity of power-down configurations, resulting in a range of power consumption values (indicated as "B" in FIG. 1) in order to determine which of the configurations gives the lowest power consumption while retaining the desired signal quality metric. This methodology is particularly effective in high order filters with multiple taps, and in decoder blocks that might implement a trellis decoder in a fully functional form, but which might be adequate when truncated to a simple slicer in certain situations.

No matter how implemented, however, all that is required for practice of the invention is that power consumption be established as one basis of an evaluation matrix, and that some signal quality or device performance characteristic, having a relationship to device power consumption, be established as another. As one of the bases are defined, as by a user input, for example, the other basis is locally maximized (in the case of performance) or minimized (in the case of power) by an adaptive and dynamic procedure that chooses the most pertinent portions of an integrated circuit to disable. The procedure is adaptive in the sense that it is not fixed in time. As channel and signal characteristics can be expected to vary with time, a changing signal quality metric will force a re-evaluation of the matrix. A further reduction of power consumption, or a further enhancement of signal quality may be obtained.

In order to appreciate the advantages of the present invention, it will be beneficial to describe the invention in the context of an exemplary bidirectional communication device, such as an Ethernet transceiver. The particular exemplary implementation chosen is depicted in FIG. 2, which is a simplified block diagram of a multi-pair communication system operating in conformance with the IEEE 802.3ab standard (also termed 1000BASE-T) for 1 gigabit (Gb/s) Ethernet full-duplex communication over four twisted pairs of Category-5 copper wires.

Figure 2:
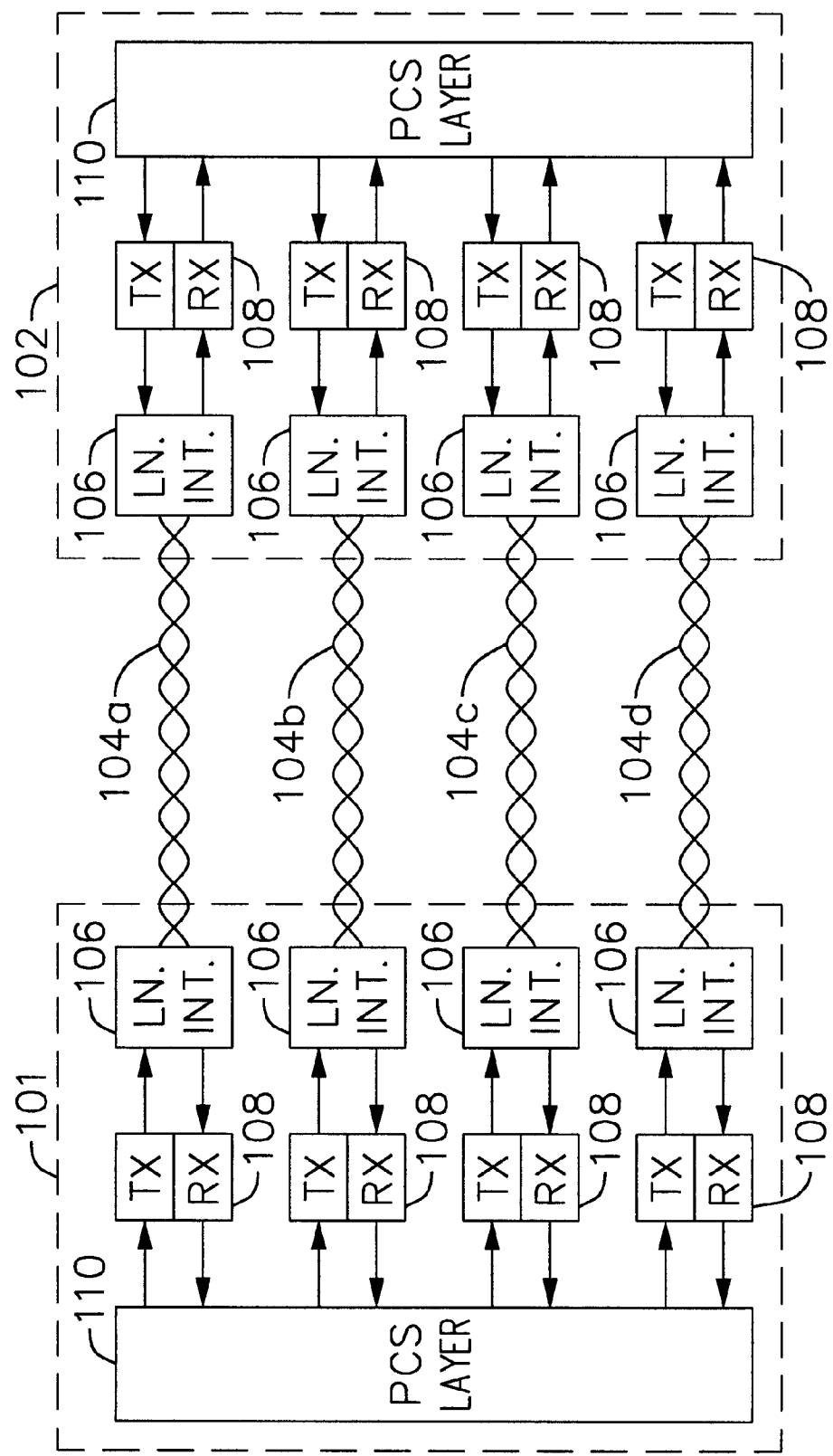
FIG. 2 is a simplified, semi-schematic block diagram of a high-speed bidirectional communication system exemplified by two transceivers configured to communicate over multiple twisted-pair wiring channels.

The communication system illustrated in FIG. 2 is represented as a point-to-point system, in order to simplify the explanation, and includes two main transceiver blocks 101 and 102, coupled together via four twisted-pair cables 104a, b, c and d. Each of the wire pairs 104a, b, c, d is coupled to each of the transceiver blocks 101, 102 through a respective one of four line interface circuits 106. Each of the wire pairs 104a, b, c, d facilitates communication of information between corresponding pairs of four pairs of transmitter/receiver circuits (constituent transceivers) 108. Each of the constituent transceivers 108 is coupled between a respective line interface circuit 106 and a Physical Coding Sublayer (PCS) block 110. At each of the transceiver blocks 101 and 102, the four constituent transceivers 108 are capable of operating simultaneously at 250 megabits of information data per second (Mb/s) each, and are coupled to the corresponding remote constituent transceivers through respective line interface circuits to facilitate full-duplex bidirectional operation. Thus, 1 Gb/s communication throughput of each of the transceiver blocks 101 and 102 is achieved by using four 250 Mb/s (125 Mbaud at 2 information data bits per symbol) constituent transceivers 108 for each of the transceiver blocks 101, 102 and four pairs of twisted copper cables to connect the two transceiver blocks 101, 102 together.

The exemplary communication system of FIG. 2 has a superficial resemblance to a 100BASE-T4 system, but is configured to operate at ten times the bit rate. As such, it should be understood that certain system performance characteristics, such as sampling rates and the like, will be consequently higher and cause a greater degree of power consumption. Also, at gigabit data rates over potentially noisy channels, a proportionately greater degree of signal processing is required in many instances to insure an adequate degree of signal fidelity and quality.

Figure 3:
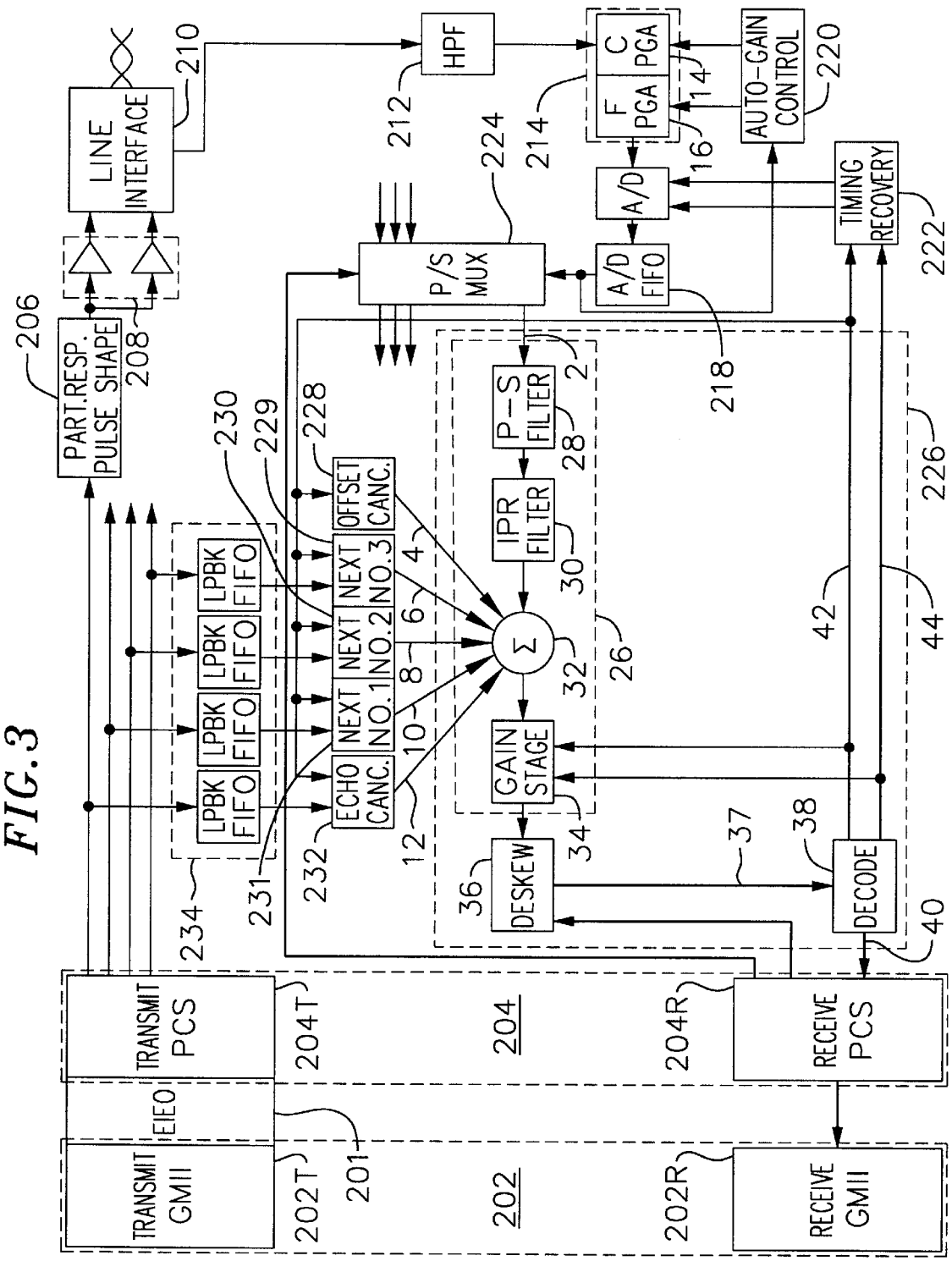
FIG. 3 is a simplified, semi-schematic block diagram of a bidirectional communication transceiver, constructed in accordance with the present invention.

FIG. 3 is a simplified block diagram of the functional architecture and internal construction of an exemplary transceiver block, indicated generally at 200, such as transceiver 101 of FIG. 2. Since the illustrative transceiver application relates to gigabit Ethernet transmission, the transceiver will be refered to as the "gigabit transceiver". For ease of illustration and description, FIG. 3 shows only one of the four 250 Mb/s constituent transceivers which are operating simultaneously (termed herein 4-D operation). However, since the operation of the four constituent transceivers are necessarily interrelated, certain blocks and signal lines in the exemplary embodiment of FIG. 3 perform four-dimensional operations and carry four-dimensional (4-D) signals, respectively. By 4-D, it is meant that the data from the four constituent transceivers are used simultaneously. In order to clarify signal relationships in FIG. 3, thin lines correspond to 1-dimensional functions or signals (i.e., relating to only a single constituent transceiver), and thick lines correspond to 4-D functions or signals (relating to all four constituent transceivers).

Referring to FIG. 3, the gigabit transceiver 200 includes a Gigabit Medium Independent Interface (GMII) block 202 subdivided into a receive GMII circuit 202R and a transmit GMII circuit 202T. The transceiver also includes a Physical Coding Sublayer (PCS) block 204, subdivided into a receive PCS circuit 204R and a transmit PCS circuit 204T, a pulse shaping filter 206, a digital-to analog (D/A) converter block 208, and a line interface block 210, all generally encompassing the transmitter portion of the transceiver.

The receiver portion generally includes a highpass filter 212, a programmable gain amplifier (PGA) 214, an analog-to-digital (A/D) converter 216, an automatic gain control (AGC) block 220, a timing recovery block 222, a pair-swap multiplexer block 224, a demodulator 226, an offset canceller 228, a near-end crosstalk (NEXT) canceller block 230 having three constituent NEXT cancellers and an echo canceller 232.

The gigabit transceiver 200 also includes an A/D first-in-first-out buffer (FIFO) 218 to facilitate proper transfer of data from the analog clock region to the receive clock region, and a loopback FIFO block (LPBK) 234 to facilitate proper transfer of data from the transmit clock region to the receive clock region. The gigabit transceiver 200 can optionally include an additional adaptive filter to cancel far-end crosstalk noise (FEXT canceller).

In operational terms, on the transmit path, the transmit section 202T of the GMII block receives data from the Media Access Control (MAC) module in byte-wide format at the rate of 125 MHz and passes them to the transmit section 204T of the PCS block via the FIFO 201. The FIFO 201 ensures proper data transfer from the MAC layer to the Physical Coding (PHY) layer, since the transmit clock of the PHY layer is not necessarily synchronized with the clock of the MAC layer. In one embodiment, this small FIFO 201 has from about three to about five memory cells to accommodate the file elasticity requirement which is a function of frame size and frequency offset.

The PCS transmit section 204T performs certain scambling operations and, in particular, is responsible for encoding digital data into the requisite codeword representations appropriate for transmission. In, the illustrated embodiment of FIG. 3, the transmit PCS section 204T incorporates a coding engine and signal mapper that implements a trellis coding architecture, such as required by the IEEE 802.3ab specification for gigabit transmission.

In accordance with this encoding architecture, the PCS transmit section 204T generates four 1-D symbols, one for each of the four constituent transceivers. The 1-D symbol generated for the constituent transceiver depicted in FIG. 3 is filtered by the pulse shaping filter 206. This filtering assists in reducing the radiated emission of the output of the transceiver such that it falls within the parameters required by the Federal Communications Commission. The pulse shaping filter 206 is implemented so as to define a transfer function of $0.75+0.25\ z^{-1}$. This particular implementation is chosen so that the power spectrum of the output of the transceiver falls below the power spectrum of a 100Base-Tx signal. The 100Base-Tx is a widely used and accepted Fast Ethernet standard for 100 Mb/s operation on two pairs of Category-5 twisted pair cables. The output of the pulse shaping filter 206 is converted to an analog signal by the D/A converter 208 operating at 125 MHz. The analog signal passes through the line interface block 210, and is placed on the corresponding twisted pair cable.

On the receive path, the line interface block 210 receives an analog signal from the twisted pair cable. The received analog signal is preconditioned by the highpass filter 212 and the PGA 214 before being converted to a digital signal by the A/D converter 216 operating at a sampling rate of 125 MHz. The timing of the A/D converter 216 is controlled by the output of the timing recovery block 222. The resulting digital signal is properly transferred from the analog clock region to the receive clock region by the A/D FIFO 218. The output of the A/D FIFO 218 is also used by the AGC 220 to control the operation of the PGA 214.

The output of the A/D FIFO 218, along with the outputs from the A/D FIFOs of the other three constituent transceivers are inputted to the pair-swap multiplexer block 224. The pair-swap multiplexer block 224 uses the 4-D pair-swap control signal from the receive section 204R of PCS block to sort out the four input signals and send the correct signals to the respective feedforward equalizers 26 of the demodulator 226. This pair-swapping control is needed for the following reason. The trellis coding methodology used for the gigabit transceivers (101 and 102 of FIG. 1) is based on the fact that a signal on each twisted pair of wire corresponds to a respective 1-D constellation, and that the signals transmitted over four twisted pairs collectively form a 4-D constellation. Thus, for the decoding to work, each of the four twisted pairs must be uniquely identified with one of the four dimensions. Any undetected swapping of the four pairs would result in erroneous decoding. In an alternate embodiment of the gigabit transceiver, the pair-swapping control is performed by the demodulator 226, instead of the combination of the PCS receive section 204R and the pair-swap multiplexer block 224.

The demodulator 226 includes a feed-forward equalizer (FFE) 26 for each constituent transceiver, coupled to a deskew memory circuit 36 and a decoder circuit 38, implemented in the illustrated embodiment as a trellis decoder. The deskew memory circuit 36 and the trellis decoder 38 are common to all four constituent transceivers. The FFE 26 receives the received signal intended for it from the pair-swap multiplexer block 224. The FFE 26 is suitably implemented to include a precursor filter 28, a programmable inverse partial response (IPR) filter 30, a summing device 32, and an adaptive gain stage 34. The FFE 26 is a least-mean-squares (LMS) type adaptive filter which is configured to perform channel equalization as will be described in greater detail below.

The precursor filter 28 generates a precursor to the input signal 2. This precursor is used for timing recovery. The transfer function of the precursor filter 28 might be represented as $-\gamma+z^{-1}$, with $\gamma$ equal to $\frac{1}{16}$ for short cables (less than 80 meters) and $\frac{1}{8}$ for long cables (more than 80 m). The determination of the length of a cable is based on the gain of the coarse PGA 14 of the programmable gain block 214.

The programmable IPR filter 30 compensates the ISI (intersymbol interference) introduced by the partial response pulse shaping in the transmitter section of a remote transceiver which transmitted the analog equivalent of the digital signal 2. The transfer function of the IPR filter 30 may be expressed as $1/(1+Kz^{-1})$. In the present example, K has an exemplary value of 0.484375 during startup, and is slowly ramped down to zero after convergence of the decision feedback equalizer included inside the trellis decoder 38. The value of K may also be any positive value strictly less than 1.

The summing device 32 receives the output of the IPR filter 30 and subtracts therefrom adaptively derived cancellation signals received from the adaptive filter block, namely signals developed by the offset canceller 228, the NEXT cancellers 230, and the echo canceller 232. The offset canceller 228 is an adaptive filter which generates an estimate of signal offset introduced by component circuitry of the transceiver's analog front end, particularly offsets introduced by the PGA 214 and the A/D converter 216.

The three NEXT cancellers 230 may also be described as adaptive filters and are used, in the illustrated embodiment, for modeling the NEXT impairments in the received signal caused by interference generated by symbols sent by the three local transmitters of the other three constituent transceivers. These impairments are recognized as being caused by a crosstalk mechanism between neighboring pairs of cables, thus the term near-end crosstalk, or NEXT. Since each receiver has access to the data transmitted by the other three local transmitters, it is possible to approximately replicate the NEXT impairments through filtering. Referring to FIG. 3, the three NEXT cancellers 230 filter the signals sent by the PCS block to the other three local transmitters and produce three signals replicating the respective NEXT impairments. By subtracting these three signals from the output of the IPR filter 30, the NEXT impairments are approximately cancelled.

Due to the bi-directional nature of the channel, each local transmitter causes an echo impairment on the received signal of the local receiver with which it is paired to form a constituent transceiver. In order to remove this impairment, an echo canceller 232 is provided, which may also be characterized as an adaptive filter, and is used, in the illustrated embodiment, for modeling the signal impairment due to echo. The echo canceller 232 filters the signal sent by the PCS block to the local transmitter associated with the receiver, and produces an approximate replica of the echo impairment. By subtracting this replica signal from the output of the IPR filter 30, the echo impairment is approximately cancelled.

The adaptive gain stage 34 receives the processed signal from the summing circuit 32 and fine tunes the signal path gain using a zero-forcing LMS algorithm. Since this adaptive gain stage 34 trains on the basis of error signals generated by the adaptive filters 228, 230 and 232, it provides a more accurate signal gain than the one provided by the PGA 214 in the analog section.

The output of the adaptive gain stage 34, which is also the output of the FFE 26, is inputted to the deskew memory circuit 36. The deskew memory 36 is a four-dimensional function block, i.e., it also receives the outputs of the three FFEs of the other three constituent transceivers. There may be a relative skew in the outputs of the four FFEs, which are the four signal samples representing the four symbols to be decoded. This relative skew can be up to 50 nanoseconds, and is due to the variations in the way the copper wire pairs are twisted. In order to correctly decode the four symbols, the four signal samples must be properly aligned. The deskew memory aligns the four signal samples received from the four FFEs, then passes the deskewed four signal samples to a decoder circuit 38 for decoding.

In the context of the exemplary embodiment, the data received at the local transceiver was encoded before transmission, at the remote transceiver. In the present case, data might be encoded using an 8-state four-dimensional trellis code, and the decoder 38 might therefore be implemented as a trellis decoder. In the absence of intersymbol interference (ISI), a proper 8-state Viterbi decoder would provide optimal decoding of this code. However, in the case of Gigabit Ethernet, the Category-5 twisted pair cable introduces a significant amount of ISI. In addition, the partial response filter of the remote transmitter on the other end of the communication channel also contributes some ISI. Therefore, the trellis decoder 38 must decode both the trellis code and the ISI, at the high rate of 125 MHz. In the illustrated embodiment of the gigabit transceiver, the trellis decoder 38 includes an 8-state Viterbi decoder, and uses a decision-feedback sequence estimation approach to deal with the ISI components.

The 4-D output of the trellis decoder 38 is provided to the PCS receive section 204R. The receive section 204R of the PCS block de-scrambles and decodes the symbol stream, then passes the decoded packets and idle stream to the receive section 202T of the GMII block which passes them to the MAC module. The 4-D outputs, which are the error and tentative decision, respectively, are provided to the timing recovery block 222, whose output controls the sampling time of the A/D converter 216. One of the four components of the error and one of the four components of the tentative decision correspond to the receiver shown in FIG. 3, and are provided to the adaptive gain stage 34 of the FFE 26 to adjust the gain of the equalizer signal path. The error component portion of the decoder output signal is also provided, as a control signal, to adaptation circuitry incorporated in each of the adaptive filters 228, 229, 230, 231 and 232. Adaptation circuitry is used for the updating and training process of filter coefficients.

Figure 4:
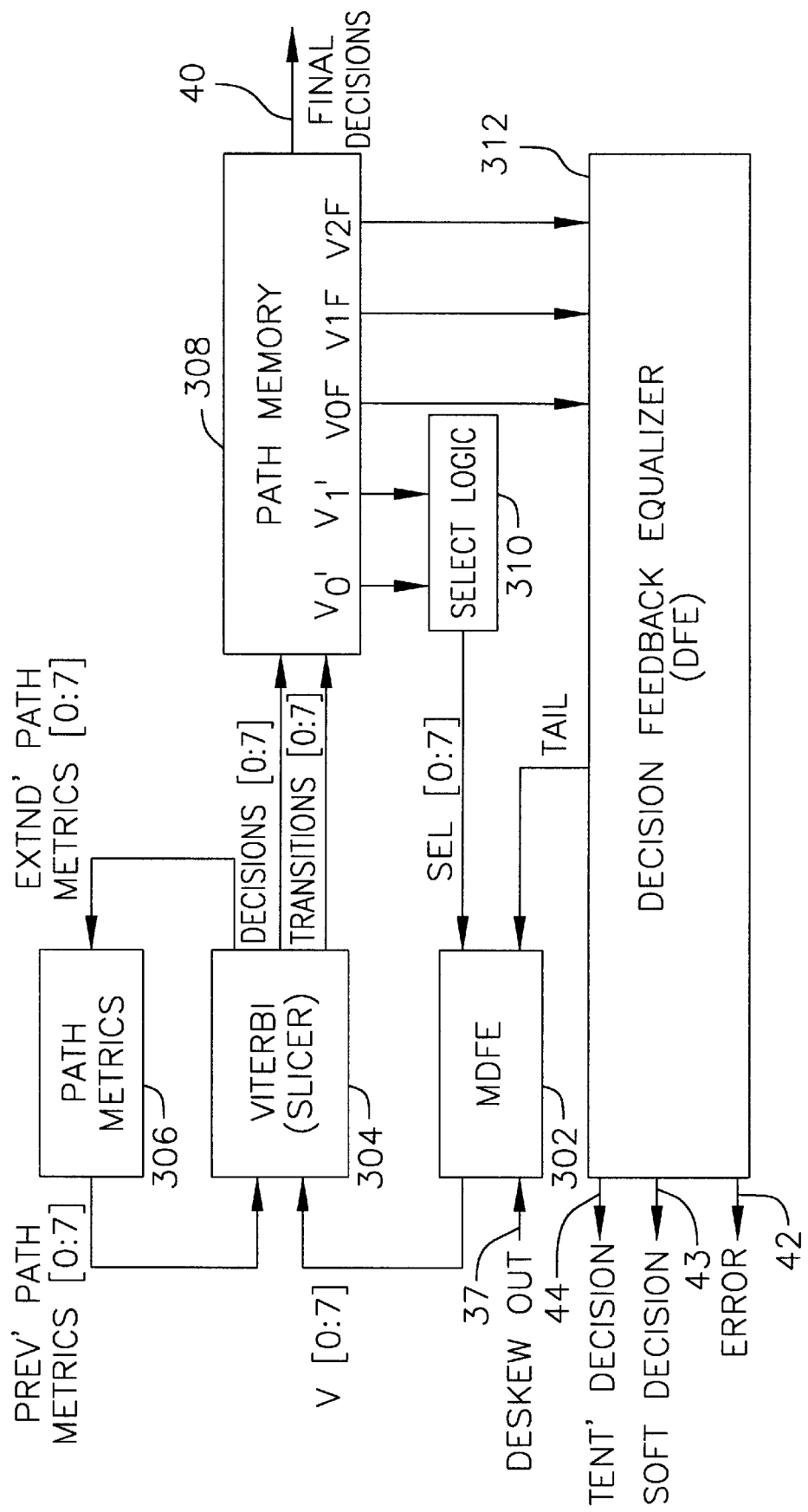
FIG. 4 is a simplified block diagram of a trellis decoder such as might be incorporated into the exemplary transceiver of FIG. 3.

FIG. 4 is a block diagram of the trellis decoder 38 of FIG. 3. The trellis decoder 38 includes a multiple decision feedback equalizer (MDFE) 302, a Viterbi decoder 304, a path metrics module 306, a path memory module 308, a select logic 310, and a decision feedback equalizer 312. There are eight Viterbi inputs and eight Viterbi decisions corresponding to the eight states. Each of the eight Viterbi inputs (respectively, decisions) is a 4-dimensional vector whose four components are the Viterbi inputs (respectively, decisions) for the four constituent transceivers, respectively.

Figure 5A:
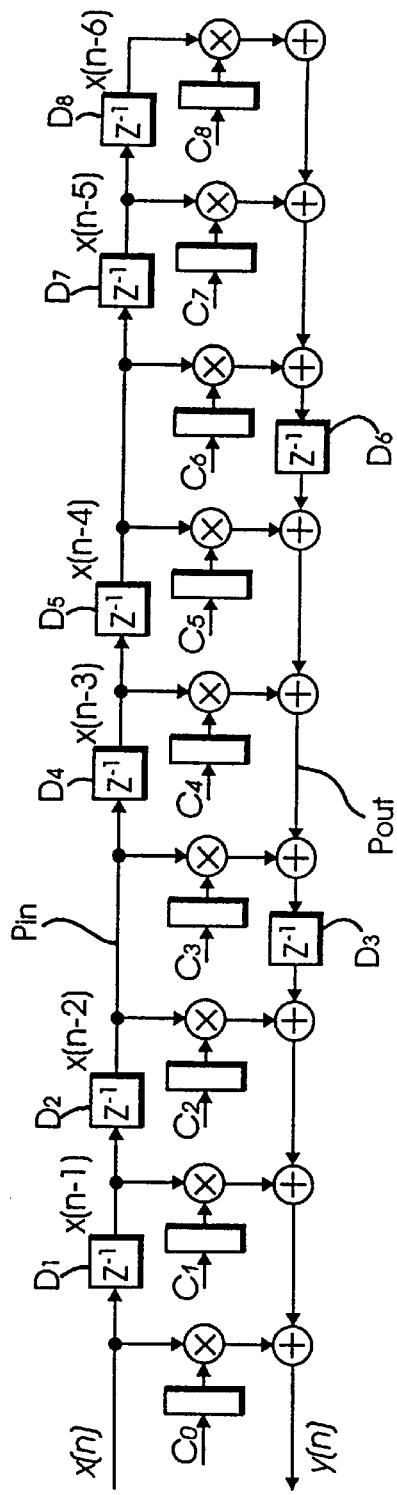
FIG. 5A is a simplified structure diagram of an adaptive FIR filter as might be implemented as an echo/NEXT canceller circuit in one embodiment of a transceiver in accordance with the present invention.

The adaptive filters used to implement the echo canceller 232 and the NEXT cancellers 229, 230 and 231 are typically finite impulse response (FIR) filters. FIG. 5A shows a structure of an adaptive FIR filter used as an echo/NEXT canceller in one embodiment of the gigabit transceiver.

Referring to FIG. 5A, the adaptive FIR filter includes an input signal path $P_{in}$, an output signal path $P_{out}$, and N taps (N is nine in FIG. 5A). Each tap connects a point on the input signal path $P_{in}$ to a point on the output signal path $P_{out}$. Each tap, except for the last tap, includes a coefficient $C_i$, a multiplier $M_i$ and an adder $A_i$, i=0, . . . , N−2. The last tap includes the coefficient $C_{N-1}$, the multiplier $M_{N-1}$, and no adder. The coefficients $C_i$, where i=0, . . . , N−1, are stored in coefficient registers. During each adaptation process, the values of the coefficients $C_i$ are trained using a well-known least-mean-squares algorithm by an adaptation circuitry (not shown in FIG. 5A). After training, the coefficients $C_i$ converge to stable values. The FIR filter includes a set of delay elements $D_i$, conventionally denoted by $z^{-1}$ in FIG. 5A. The number of delay elements $D_i$ determines the order of the FIR filter. The output y(n), i.e., the filter output at time instant n, is a function of the input at time instant n and of the past inputs at time instants n−1 through n−(N−1), and is expressed as:

$$y(n) = \sum_{i=0}^{N-1} C_i x(n-i) \quad (1)$$

where x(n−i) denotes the input at time instant n−i, and N denotes the number of taps. The output y(n), as shown in Equation (1), is a weighted sum of the input data x(n−i), with i=0, . . . , N−1. The coefficients $C_i$ act as the weighting factors on the input data. If a coefficient $C_i$ has a very small absolute value, relative to the values of other coefficients, then the contribution of the corresponding input data x(n−i) to the value of y(n) is relatively insignificant.

Figure 5B:
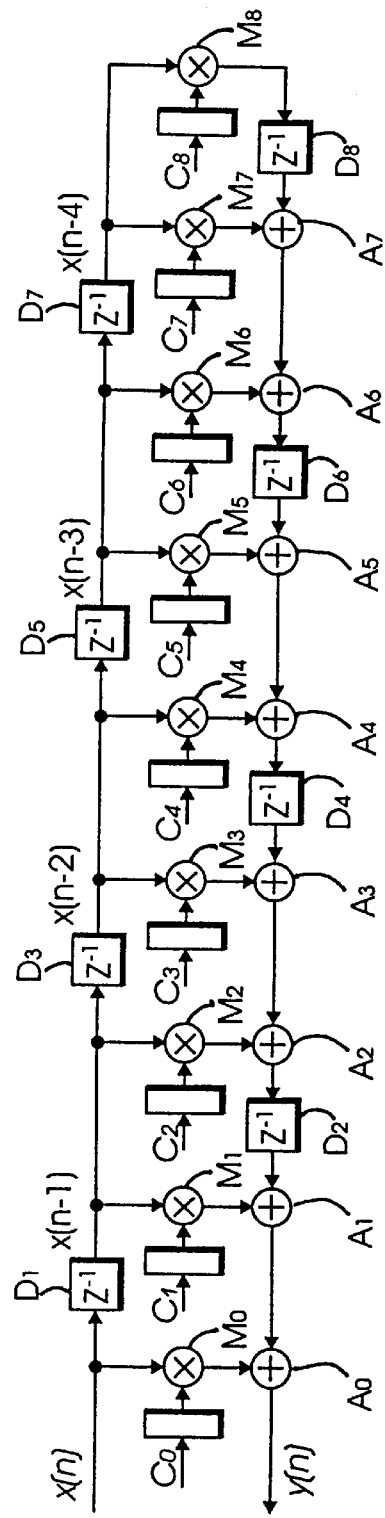
FIG. 5B is an equivalent structure of the adaptive FIR filter shown in FIG. 5A.

FIG. 5B is an equivalent structure of the filter shown in FIG. 5A. The two structures in FIGS. 5A and 5B provide the same filter transfer function, but differ in certain performance characteristics. The difference is due to the placement of the delay elements $D_i$, i=1, . . . , N−1 (N=9 in FIGS. 5A, 5B). If all the delay elements are placed in the input path $P_{in}$, as in the well-known direct form of the FIR filter, then the registers that are used to implement the delay elements are small, need only to be of the same size as the input data x(n). If all the delay elements are placed on the output path $P_{out}$, as in the well-known transposed form of the FIR filter, then the registers used as the delay elements must have more bits in order to hold the largest possible sum of products $C_i^* x(n-i)$. Large registers cost more and consume more power than small registers. Thus, the advantage of placing the delay elements on the input path instead of the output path is that fewer register bits are required. However, the larger the number of the delay elements on the input path, the lower the operating speed of the filter is.

If the propagation delay from the input of the filter to the last tap exceeds the required clock period, then the filter is not usable. To break the long propagation delay, that would occur if all the delay elements were placed on the input path $P_{in}$, into small delay intervals, some of the delay elements are placed on the output path $P_{out}$, at regular intervals, as shown in the filter structures in FIGS. 5A and 5B. The structure in FIG. 5B, which has a "two-to-one" split of delay elements between the input path and the output path, can operate at a higher clock speed than the structure in FIG. 5A, which has a "three-to-one" split. Computational results show that both of these structures are acceptable for use in a high-speed system such as the gigabit transceiver.

Figure 5C:
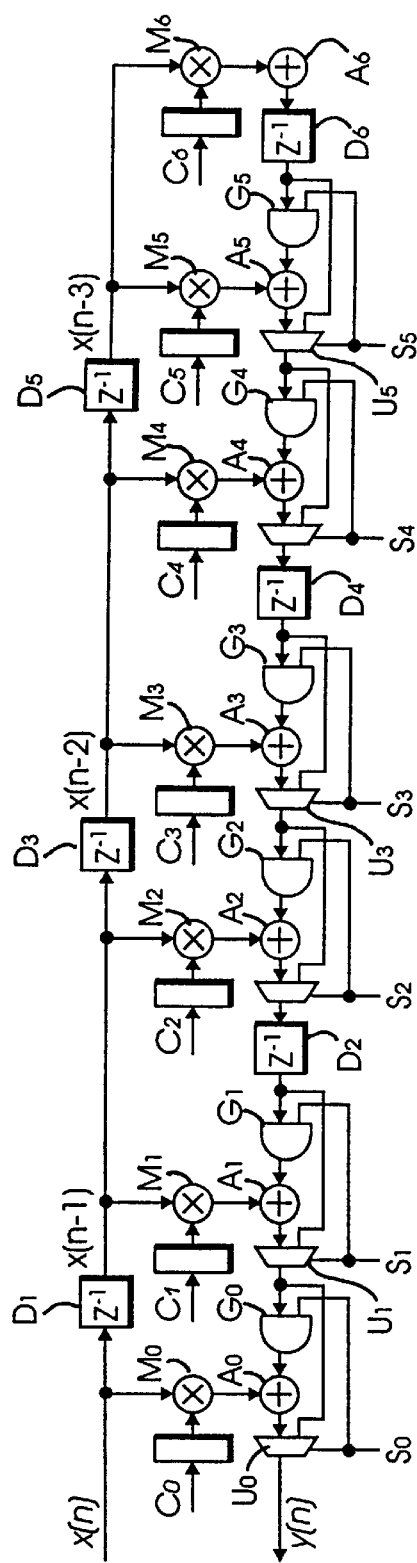
FIG. 5C is a simplified structure diagram of an alternative adaptive FIR filter including a modification to the structure of FIG. 5B to bypass a deactivated tap.

The taps of the adaptive FIR filters used in the gigabit transceiver can be switched from an active state to an inactive state. FIG. 5C shows a modification to the structure of FIG. 5B to bypass a deactivated tap.

Referring to FIG. 5C, the filter structure includes a bypass circuit for each adder $A_i$, i=0, . . . , N−1. Each bypass circuit includes a gate $G_i$ indicated as an AND gate, and a multiplexer $U_i$. Also associated with each bypass circuit is a control signal $S_i$ which indicates the active or inactive state of the tap having the coefficient $C_i$ and the adder $A_i$. $S_i$ is set equal to one if the tap is intended to be active, and set equal to zero if the tap is intended to be inactive. When $S_i=1$, the output of any arbitrarily chosen gate $G_i$ is equal to the data signal at the input of that gate $G_i$. At the corresponding multiplexer $U_i$, in the case where $S_i=1$, only the output signal from the adder $A_i$ is outputted by the multiplexer. In the case where $S_i=0$, the output of gate $G_i$ is zero, and the data signal at the input of gate $G_i$ flows to the multiplexer $U_i$ via the corresponding bypass connection $B_i$, bypassing the adder $A_i$. At the multiplexer $U_i$, due to $S_i=0$, only the data signal from the bypass connection $B_i$ is outputted.

The foregoing is only one exemplary implementation of a filter configuration wherein taps can be switched between active and inactive states. An alternative implementation is one where the multipliers $M_i$ coupled to receive filter coefficients from associated coefficient registers are able to be switched between active and inactive states.

Figure 5D:
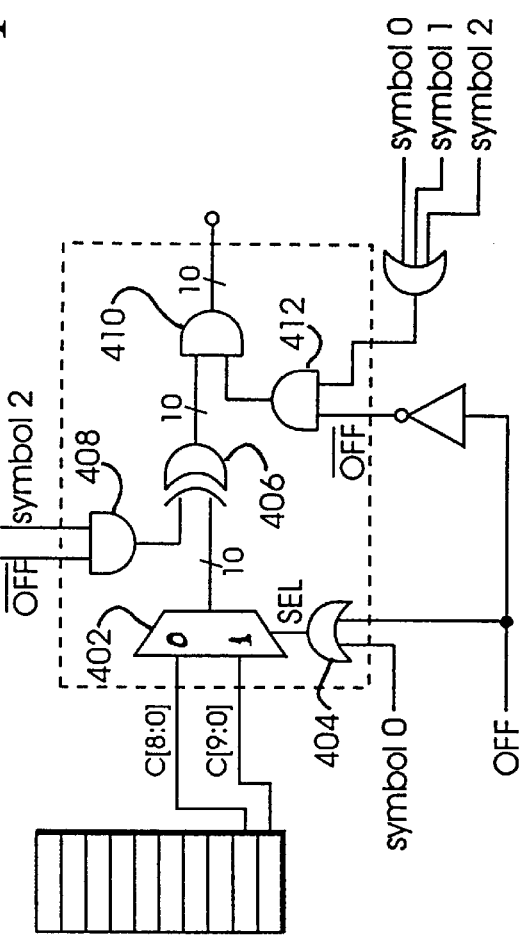
FIG. 5D is a simplified block diagram of a deactivate-able coefficient multiplier circuit such as might be implemented in the filters of FIGS. 5A, 5B and 5C.

FIG. 5D is a semi-schematic block diagram of a multiplier 400, such as might be associated with each tap coefficient. The multiplier 400 is configured to receive a coefficient word, from a corresponding coefficient register. The coefficient word is received in a multiplexer circuit 402, which receives the coefficient in two configurations: a first "raw" configuration taken directly from the coefficient register, and a second "times 2" configuration taken from the register but shifted one position to the left. The second coefficient configuration, then, represents the "raw" value multiplied by two. Since the second coefficient configuration is a shifted one and, necessarily contains one fewer bit than the "raw" coefficient, the "times two" coefficient set is padded by the bit value 0 (this is done by tying the least significant bit to $V_{SS}$, which is ground). This is a particularly efficient implementation of a multiplier which takes advantage of the fact that the symbols can only have the values {−2, −1, 0, +1, +2}. The symbols are represented by three bits in sign-magnitude representation, with bit 2 indicating the sign (+ or −).

A select OR gate 404 "ORs" an OFF signal with the value of symbol bit 0 to select which coefficient representation is selected to pass through the multiplexer 402. When the value of symbol bit 0 is 1, the "raw" coefficient, representing either −1, 0, +1 is selected. When OFF is equal to logical 1, the same condition applies. The coefficient selected by multiplexer 402 is directed to one input of an XOR gate where it is exclusively "ORed" with an output signal from a select AND gate 408. The AND gate 408 "ANDs" an inverted OFF signal with the symbol bit 2 value. When OFF is logical 0, i.e., inverted OFF is logical 1, and when symbol bit 2 is 1, the XOR functions to designate that the sign of the coefficient is negative. It should be understood that the XOR is configured as a stack (of 10 individual XOR gates), and that manipulation of the carry bit determines the sign of the coefficients.

The signed coefficient is directed to an additional AND gate 410, where it is "ANDed" with the output of a second select AND gate 412. The output of second select AND gate 412 is developed by "ANDing" the inverted OFF signal with the "ORed" result between symbol bits 0, 1 and 2. The effective function of OR gate 414 is to differentiate between the symbol zero value and the other symbol values. In effect, OR gate 414 is a symbol {0} detect circuit.

Tap disablement is a function of the OFF signal value. When OFF is logical 1, the multiplexer is set to select "one", i.e., the "raw" coefficient. When OFF equal to logical 1, inverted OFF is logical 0, causing the first and second select AND gates 408 and 412 to output a zero regardless of the value of the symbol bit input. Since the output of AND gate 412 is zero, the AND gate stack 410 also outputs a zero, which is directed to a corresponding tap adder $A_i$ in the output path of the adaptive filter (FIGS. 5A, 5B or 5C). Adding a zero requires no computation and the tap is thus effectively deactivated.

The underlying reason for ORing the OFF signal in the OR gate 404 and for ANDing the inverse OFF signal in the AND gate 408 is to ensure that no transitions take place inside the multiplier when the tap is deactivated. Without the OFF signal as input to the OR gate 404, the select input to the multiplexer 402 will toggle depending on the value of the symbol bit 0. Without the inverse OFF signal as input to the AND gate 408, one of the two inputs to the XOR 406 will toggle depending on the value of the symbol bit 2. This toggling, or transition, would dissipate power. The reason for ANDing the inverse OFF signal in the AND gate 412 is to ensure that the multiplier output (which is the output of AND gate 410) is zero when the tap is deactivated.

Referring back to FIG. 3, the adaptive FIR filters used as the echo canceller 232 and the three NEXT cancellers 229, 230 and 231, require large numbers of taps to be effective as cancellers for a wide range of twisted pairs of cables. Echo/NEXT responses differ for different cables, and require different taps in the cancellers to model them. Therefore, cancellers are built with enough taps to provide adequate cancellation with the worst-case expected cable responses. For example, in the illustrated embodiment of the gigabit transceiver of FIG. 3, each echo canceller has one hundred ninety two (192) taps, and each NEXT canceller has thirty six (36) taps (it is noted that there is also a total of 132 taps in the DFE which are always active). Since there are four echo cancellers (one per constituent transceiver) and twelve NEXT cancellers (three per constituent transceiver) in the gigabit transceiver, the total number of taps that can be activated or deactivated in the gigabit transceiver is twelve hundred (1200). When active, each of these taps consumes a small amount of power. Due to their large number, if all of the taps are active at the same time, their individual power consumption values will sum to significantly large total power consumption figure. This power consumption, if not regulated, generally causes a high degree of localized heating in an integrated circuit; often resulting in reliability issues, skewed circuit performance and, in some cases, catastrophic device failure.

Regulation of this power consumption is possible since not all of the taps are required to be active on any given channel at any given time. The taps that are not required to be active are the ones that do not significantly contribute to the performance of the system. However, which taps are not required to be active at a given time is not known a priori. Such unnecessary taps can become needed at a different time due to dynamic changes in the cable response. The present invention dynamically determines which, if any, taps are unnecessary for adequate performance in a particular application, and deactivates them. The present invention also re-activates any previously deactivated taps that subsequently become necessary, due to changes in the cable response, for system performance improvement. As applied to the adaptive filters, the method of the present invention might be characterized as a tap power regulation method.

FIG. 6 is a flowchart of a first exemplary embodiment of a method for implementing principles of the present invention. A specified error and a specified power are provided. They may be specified by a user. The specified power represents the maximum power consumption that is allowed. If no power is specified, it is assumed to be infinite. The specified error represents the maximum degradation of the system performance that is allowed and is preferably expressed as a mean squared error (MSE). Since the signal power is constant, the MSE corresponds to a ratio of mean squared error to signal(MSE/signal)usually expressed in decibels (dB).

In FIG. 6, before the start of process 500, no coefficient is active. Upon start (block 502), process 500 initializes a threshold to a value (block 504). This initial value of the threshold can result from a simulation test, or can be equal to the minimum absolute value of a tap coefficient (as known from past experiments). This value is not critical as long as it is sufficiently low to avoid a large degradation of the system performance. The taps in a first block are activated (block 506). The size of this first block, i.e., the number of taps in the first block, depends on the application. In one application, this number is 120. The coefficients of the active taps are trained with the LMS algorithm until convergence (block 508).

The absolute values of the active tap coefficients are compared with the threshold (block 510). The taps whose absolute values are less than the threshold are deactivated (block 512). An error metric, typically a mean squared error (MSE) corresponding to a ratio of mean squared error to signal, and a power metric are computed (block 514). Process 500 then checks whether a first test is satisfied (block 516). In the first embodiment of the invention, this first test is satisfied when the error metric is greater than the specified error and the power metric is smaller than the specified maximum power. If the error metric is greater than the specified error, this implies that the threshold has been set too high, causing too many taps to be deactivated, and this has degraded the system performance by more than the specified amount. If the first test is satisfied, then the threshold is decreased (block 518), and all the taps in the block being considered are activated again (block 506) and process 500 proceeds with a lower threshold. Otherwise, process 500 determines whether all the taps of the filter have been considered (block 520). If not, then the next block of taps is considered, and this new block of taps is activated (block 506). A typical size of this next block of taps is 20. All of the active tap coefficients, including the new activated tap coefficients, are converged with an LMS algorithm (block 508) and process 500 proceeds as described above.

If all of the taps have been considered, then process 500 checks whether a second test is satisfied (block 524). In the first embodiment of the invention, the second test is satisfied when the error metric is smaller than the specified error or the power metric is larger than the specified power. If the error metric is smaller than the specified error, this implies that it is possible to increase the threshold to deactivate more taps and still meet the system performance requirement. If the power metric is greater than the specified power, then the threshold must be increased to lower the power consumption, regardless of the system performance requirement. If the second test is satisfied, then the threshold is increased (block 526) and the active taps are compared with the updated threshold (block 510). Otherwise, process 500 turns off the power on the taps that are subsequent to the tap which has the last highest ordered active coefficient (block 528). In other words, if $C_k$ is the last highest ordered active coefficient, then all the taps that have the deactivated coefficients $C_{k+1}$ through $C_{N-1}$ are powered down. More details on the power down function in block 528 are provided below. Process 500 then terminates (block 530).

When process 500 is restarted (block 532), a block of taps is activated (block 506). Upon restart of process 500, the threshold is at its last value from the last application of process 500. The coefficients that were previously deactivated are activated with their values remaining at their last values before deactivation. Then process 500 proceeds as described above.

Periodic restart of process 500 is desirable for the following reason. In some cases, the echo/NEXT path impulse response may change during normal operation. For example, this change may be a result of temperature changes. To correct for this change, process 500 periodically restarts to turn on the deactivated coefficients in a sequential manner (block 506), reconverges the coefficients (block 508), and determines whether the previously deactivated coefficients are still below the threshold (block 510). If the previously deactivated coefficients are now converged to values above the threshold, they remain active, otherwise they are deactivated (block 512). Any of the initially active coefficients that now fall below the threshold are also deactivated (block 512).

The underlying reason for activating the taps a few at a time (block 506 through 520) is the following. When the total number of taps is very large, the power consumption can be very large during the initial convergence transient. This peak power consumption is very undesirable, and is unaffected by the tap power regulation process (which can only reduce the average power consumption of the filters).

One solution to this peak power consumption problem is to activate and converge the taps in an initial small block of taps (blocks 506, 508), deactivate some of the converged taps according to a criterion (block 510 through block 520), activate a next block of taps (block 506), converge all the active taps including the newly activated taps (block 508), and repeat the process of deactivation, activation and convergence until all the taps of the filter are processed.

Power-down block 528, which is optional, of process 500 helps further reduce the power consumption of the adaptive filters. Without block 528, although the tap power regulating process 500 already achieves a large reduction of the power consumption by reducing the number of active taps, there is still a significant amount of power dissipated by the long delay line of the adaptive filter. By delay line, it is meant the line connecting the delay elements together. Turning a tap off does not necessarily affect the configuration of the delay line. However, in many practical cases, many of the deactivated taps are located contiguously at the highest-ordered end of the filter. An example of such a case is when the cable is short and well behaved. In such cases, the portion of the delay line associated with these contiguously deactivated taps can be completely powered down without affecting the transfer function of the filter. This powering down contributes an additional reduction of power dissipation of the filter. In one exemplary application, this additional reduction of power dissipation is approximately 300 milliwatts (mW) per echo canceller and 70 mW per NEXT canceller, resulting in a power saving of 2.04 Watts for the gigabit transceiver.

An exemplary implementation of block 528 is as follows. An additional bit, called the delay line enable bit, is associated with each tap of a filter. This bit is initially ON. When process 500 reaches block 528, all of the taps are scanned for active status starting from the highest-ordered end of the filter, i.e., the tap including the coefficient $C_{N-1}$, towards the lowest-ordered end, i.e., the tap including the coefficient $C_0$. During scanning, the delay line enable bits of the scanned inactive taps are switched OFF until the first highest-ordered active tap is found. At this point, the scanning for tap active status terminates. Then all the delay line sections corresponding to the taps whose delay line enable bits are OFF are powered down.

Figure 7:
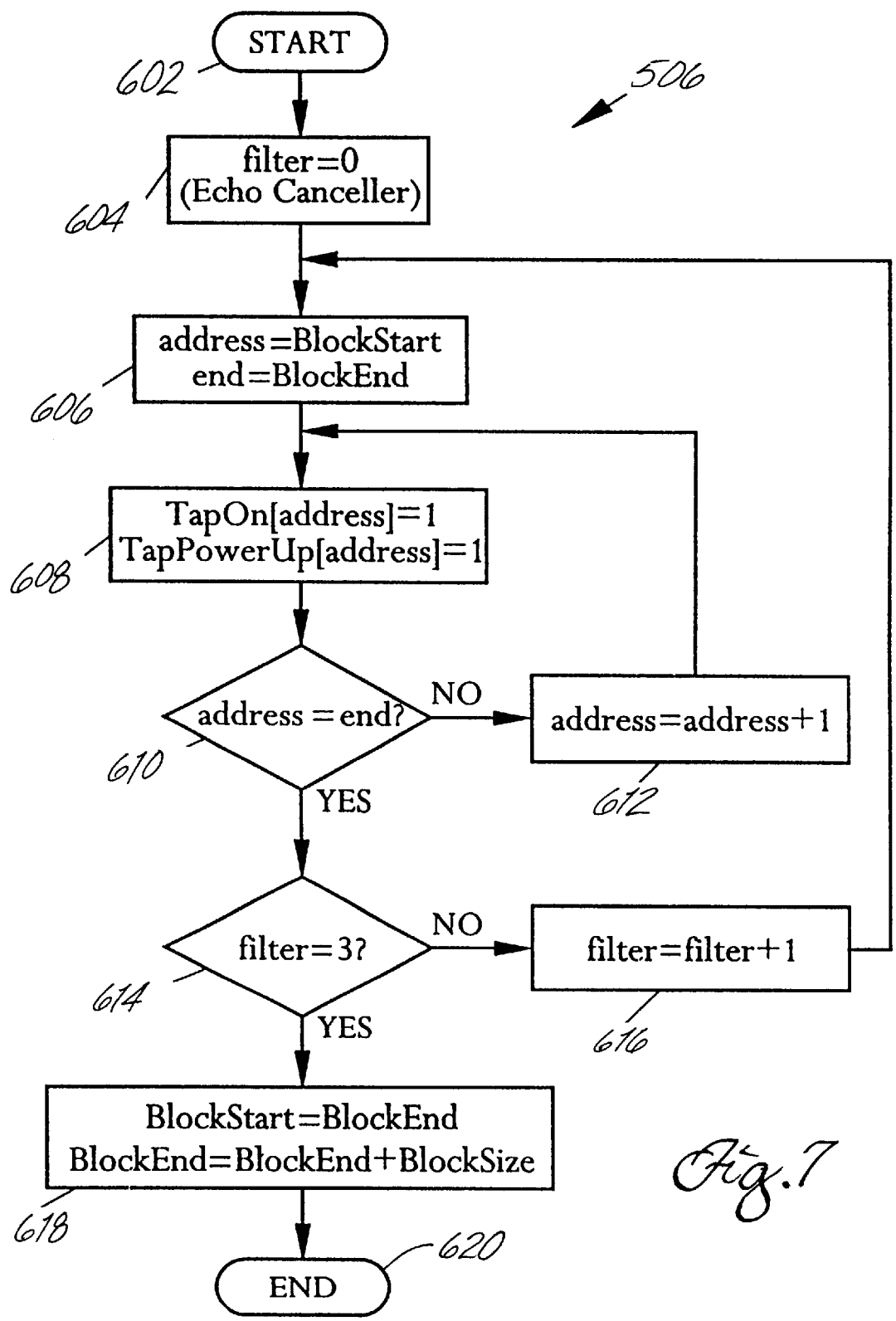
FIG. 7 is a flowchart depicting one exemplary embodiment of an activation block according to the method of FIG. 6.

Activation block 506 of FIG. 6 is applied sequentially to the echo canceller 232 and the three NEXT cancellers 229, 230 and 231 (of FIG. 3). FIG. 7 illustrates the flowchart of one exemplary embodiment of the activation block 506.

Referring to FIG. 7, upon start (block 602), the process 506 sets the filter number to zero (block 604) to operate on the echo canceller. The filter number zero represents the echo canceller, while filter numbers 1 through 3 represent the three NEXT cancellers, respectively. Process 506 then sets the address and the end equal to the start address and the end address of the block of taps, respectively (block 606). The modules TapOn and Tap PowerUp are invoked with the address as argument (block 608). The module TapOn turns on the circuitry of the tap having the specified address. This circuitry includes a 1-bit storage to indicate the active status of the tap. When the tap is turned on, the tap is included in the computation of the output y(n) of the filter (referring to Equation (1)), and in the adaptation process, i.e., the training and convergence of the filter coefficients. The module TapPowerUp turns the power on for the delay line section associated with the tap having the specified address. Process 506 then determines whether the address is equal to the end. If it is not, then the address is increased by one (block 612), to consider the next tap of the filter. If the address has reached the end address of the block of taps, then process 506 determines whether filter number is equal to 3, i.e., whether all the filters in the transceiver have been considered (block 614). If not, then filter number is increased by one, so that the next filter is considered. If process 506 has operated on all the filters, then process 506 sets the start address equal to the old end address, and sets the new end address equal to the sum of the old end address and the block size, the block size being the size of the next block of taps to be activated (block 618). Process 506 then terminates (block 620).

Figure 8:
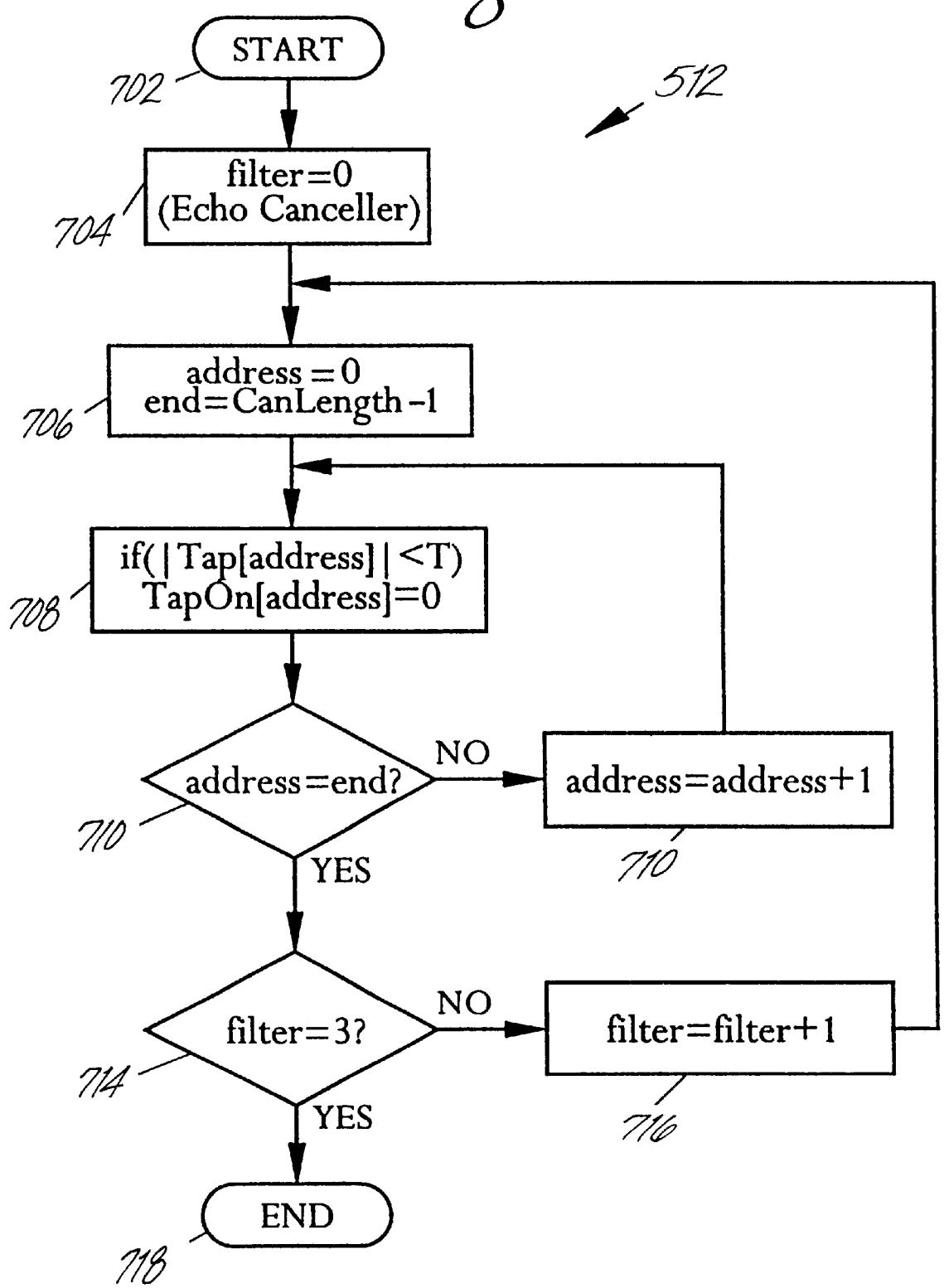
FIG. 8 is a flowchart depicting one exemplary embodiment of a deactivation block according to the method of FIG. 6.

Deactivation block 512 of FIG. 6 is applied sequentially to the echo canceller 232 and the three NEXT cancellers 230 (of FIG. 3). FIG. 8 illustrates the flowchart of one embodiment of the deactivation block 512.

Referring to FIG. 8, upon start (block 702), the process 512 sets the filter number to zero (block 704) to operate on the echo canceller. The filter number zero represents the echo canceller, while filter numbers 1 through 3 represent the three NEXT cancellers, respectively. Process 512 then sets the address equal to zero and the end equal to the length of the filter minus 1 (block 706). If the absolute value of the tap coefficient at the specified address is less than T, the threshold, then the module TapOn is invoked to turn off the circuitry associated with the tap having the specified address (block 708). When the tap is turned off, the tap is removed from the computation of the output y(n) of the filter (referring to Equation (1)), and from the adaptation process, i.e., the training and convergence of the filter coefficients. Process 512 then determines whether the address is equal to the end. If it is not, then the tap address is increased by one (block 712), to consider the next tap of the filter. If the address has reached the end of the filter taps, then process 512 determines whether filter number is equal to 3, i.e., whether all the filters in the transceiver have been considered (block 714). If not, then filter number is increased by one, so that the next filter is considered (block 716). If process 512 has operated on all the filters, then process 512 terminates (block 718).

Figure 9:
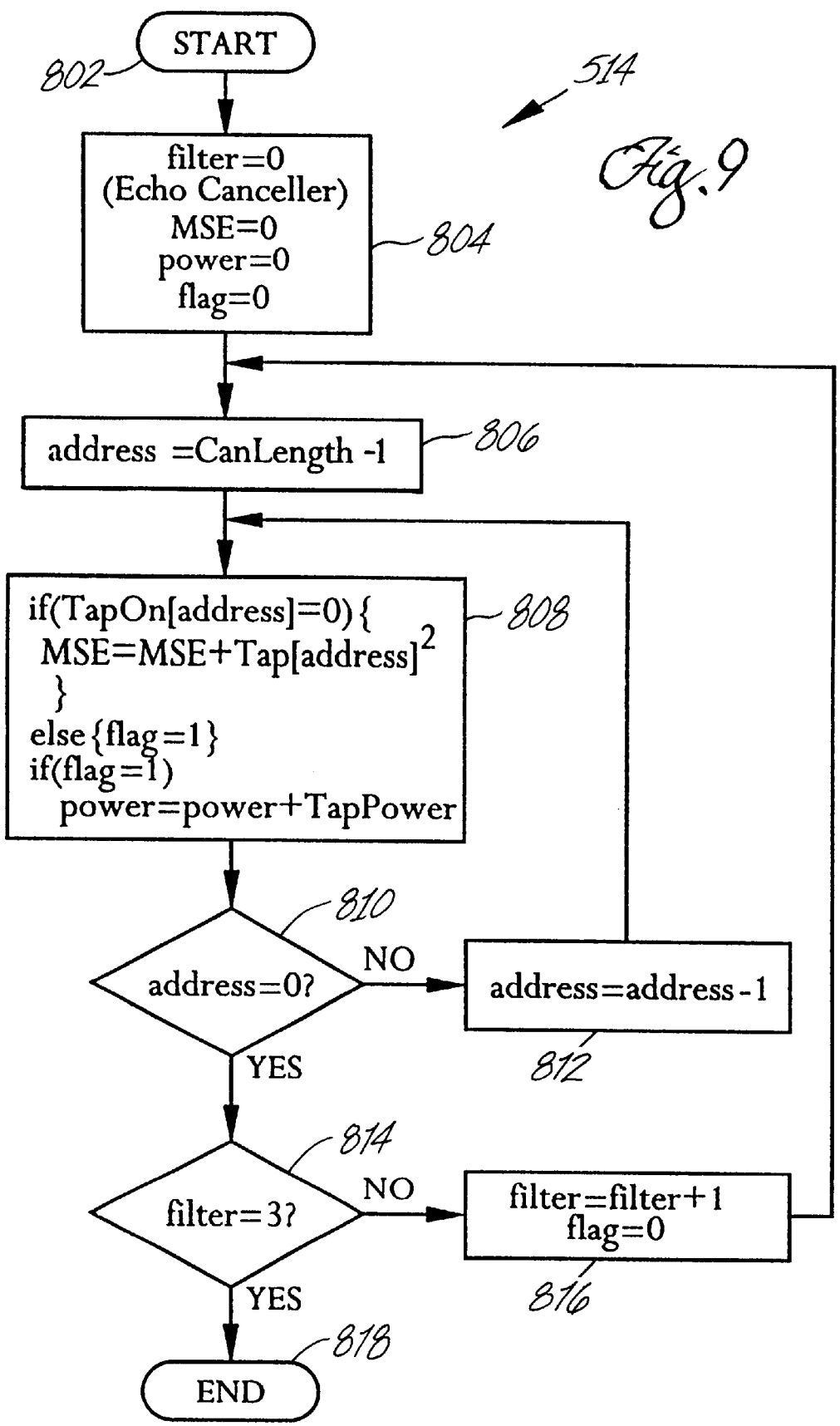
FIG. 9 is a flowchart of one embodiment of the computing block 514 of FIG. 6.

Error-computing block 514 of FIG. 6 is applied sequentially to the echo canceller 232 and the three NEXT cancellers 230 (of FIG. 3). FIG. 9 illustrates the flowchart of one embodiment of the error-computing block 514.

Referring to FIG. 9, upon start (block 802), the process 514 sets the filter number to zero (block 804) to operate on the echo canceller, and initializes the error metric MSE, the power metric and the flag. The filter number zero represents the echo canceller, while filter numbers 1 through 3 represent the three NEXT cancellers, respectively. Process 514 then sets the address equal to the length of the filter minus 1 (block 806) to scan the filter taps from the highest ordered end. The reason for using this scanning order and the flag is to ensure that the taps that will be powered down in block 528 of FIG. 6 will be excluded from the computation of the power metric. A deactivated tap still consumes a small amount of power if it is not actually powered down because of the associated delay line section. To compute the new power metric such that it can be used to accurately regulate the power consumption of the system, the process 514 must exclude from the computation the power consumption of a deactivated tap that will be powered down.

If TapOn[addr] is zero, i.e., if the tap at the specified address is turned off, then process 514 computes the new error metric MSE by adding to the previous value of MSE the squared value of the tap coefficient at the specified address. Otherwise, if the tap at the specified address is on, then the flag is set to 1. If the flag is 1, then process 514 computes the new power metric by adding to the previous value of the power metric the estimated power consumption TapPower of the tap having the specified address (block 808). TapPower is chosen from precomputed values stored in a look-up table. These precomputed values are functions of the size of the coefficients and of the active or inactive status of the coefficient.

Process 514 determines whether the address is 0 (block 810). If it is not, then the tap address is decreased by one (block 812), to consider the next tap of the filter. If the address has reached 0, then process 514 determines whether filter number is equal to 3, i.e., whether all the filters in the transceiver have been considered (block 814). If not, then filter number is increased by one, so that the next filter is considered and the flag is reset to 0 (block 816). If process 514 has operated on all the filters, then process 514 terminates (block 818).

As shown in FIG. 9, the error metric MSE is computed by summing the squared values of the deactivated tap coefficients. It is noted that the error metric can be computed differently, such as deriving it from the error component 42A of the 4-D error signal 42 outputted from the trellis decoder 38 (FIG. 3).

The MSE as measured from the error output 42 of the trellis decoder 38 (FIG. 3) will be, hereinafter, referred to as the true MSE. The MSE as measured by summing the squared values of the coefficients of the deactivated taps will be, hereinafter, referred as the proxy MSE.

There is an advantage in using the proxy MSE, instead of the true MSE, as the error metric. Since the proxy MSE is based solely on the coefficient values of the deactivated taps, it represents only one component of the noise signal of the gigabit transceiver (other components may be due to quantization noise, external noise, etc.). Therefore, the proxy MSE is unaffected when large external noise, other than echo or NEXT noise, severely affects the noise signal, hence the noise to signal ratio, of the gigabit transceiver. For this reason, the proxy MSE is preferred as the error metric.

If the true MSE is used as the error metric, then the specified error is preferably set at a value corresponding to a noise to signal ratio of about −22 dB, because, although theoretically, a true MSE corresponding to a noise to signal ratio of −19 dB is acceptable for the gigabit transceiver, in practice, it is difficult to obtain adequate system performance at that level. If the proxy MSE is used as the error metric, then the specified error is preferably set at a value corresponding to a noise to signal ratio of about −24 dB.

Figure 10:
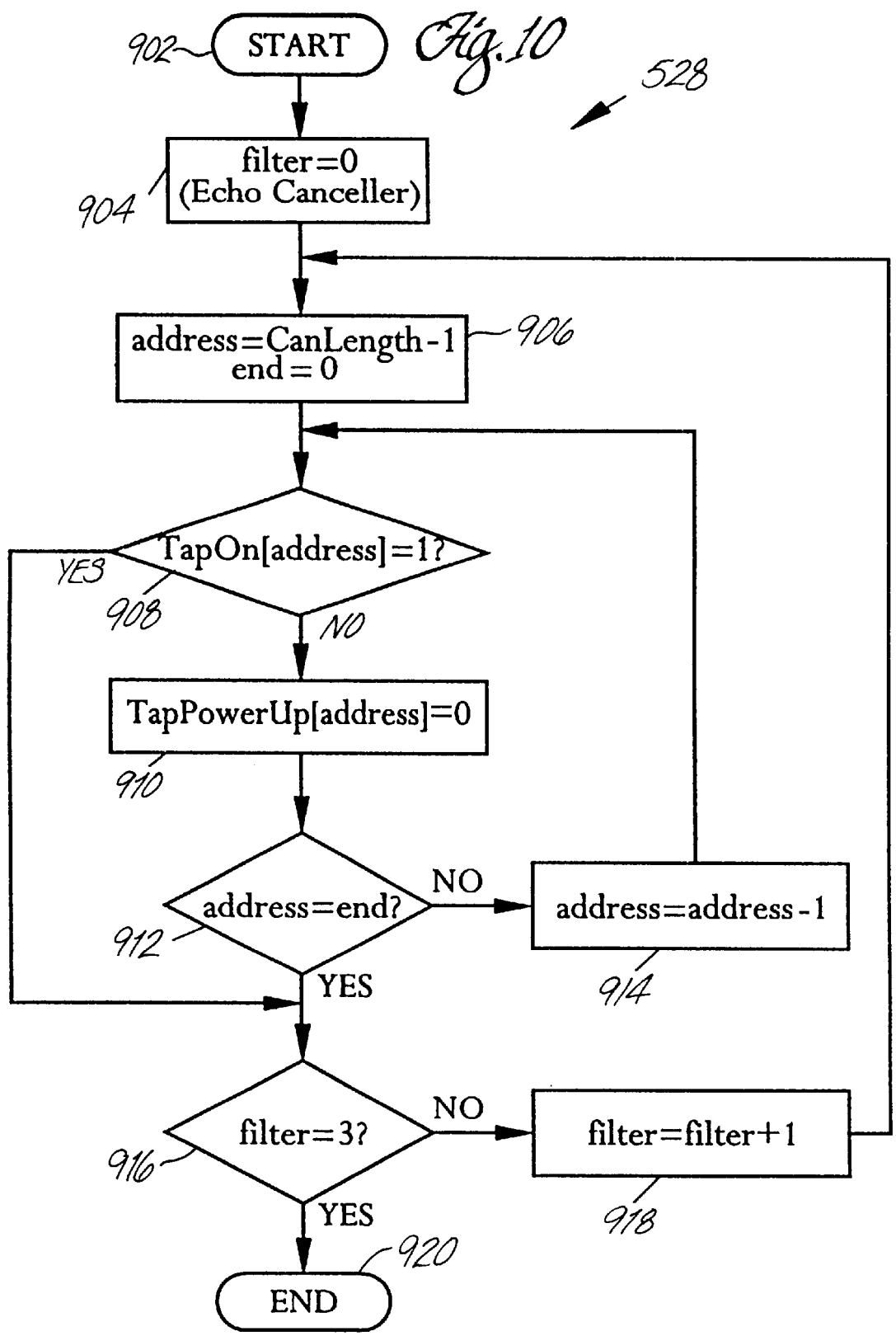
FIG. 10 is a flowchart depicting one exemplary embodiment of a power-down block according to the method of FIG. 6.

Power-down block 528 of FIG. 6 is applied sequentially to the echo canceller 232 and the three NEXT cancellers 230 (of FIG. 3). FIG. 10 illustrates the flowchart of one embodiment of the power-down block 528.

Referring to FIG. 10, upon start (block 902), the process 528 sets the filter number to zero (block 904) to operate on the echo canceller first. The filter number zero represents the echo canceller, while filter numbers 1 through 3 represent the three NEXT cancellers, respectively. Process 528 then sets the address equal to the length of the filter minus 1 and the end equal to zero (block 906). This means that the process 528 starts from the highest ordered end of the filter towards the lowest ordered end.

Process 528 determines whether TapOn[addr] is 1, i.e., whether the tap at the specified address is active (block 908). If the tap is not active, then process 528 turns off the power to the tap (block 910), then checks whether the address is equal to the end (block 912). If the address is not equal to the end, the address is decreased by 1 to consider the next lower ordered tap (block 914). If the address has reached the end, then process 528 determines whether the filter number is 3, i.e., whether all the 4 filters have been considered (block 916). If the filter is not the last one, then filter number is increased by 1 so that the next filter is considered (block 918). Otherwise, process 528 terminates (block 920).

If TapOn[addr] is 1 (block 908), i.e., if the tap at the specified address is active, then process 528 stops scanning the taps in the filter being considered, and checks the next filter, if any (block 916). Process 528 then proceeds as described above.

The process 500 of FIG. 6 is applied to the echo and NEXT cancellers of each of the 4 constituent transceivers of the gigabit transceiver 102 depicted in FIGS. 1 and 2. It is important to note that, if process 500 is applied simultaneously to the 4 constituent transceivers, there will be a power demand surge in the gigabit transceiver 102. In order to avoid such a power demand surge, process 500 is applied to the 4 transceivers in a time-staggered manner.

In a second embodiment of the present invention, two different specified errors are used in order to avoid possible limit cycle oscillations between activation and deactivation. The flowchart of the second embodiment is substantially similar to the one shown in FIG. 6. The second embodiment differs from the first embodiment by using a first specified error for the first test in block 516 (FIG. 6) and a second specified error for the second test in block 524. The first specified error is substantially larger than the second specified error. The use of the two different specified errors, sufficiently distant from each other, allow the process 500 to terminate when the computed error metric has a value located between the two specified errors. When just one specified error is used, as in the first embodiment, the computed error metric may jump back and forth around the specified error, causing the process 500 to oscillate between activation and deactivation.

In a third embodiment of the present invention, the first few taps of each filter, e.g., the first 10 taps, are exempt from deactivation in order to avoid possible degradations of the system performance in the presence of jitter. The effect of jitter on these few taps is as follows. There is usually a large slew rate in these first few taps. Due to this slew rate, their numerical values could change significantly if the sampling phase of the received signal changes. In the presence of jitter, the sampling phase of the received signal can change dynamically. Thus, if some of the first few taps were insignificant for the system performance, they could become significant as the sampling phase changes. For this third embodiment, the flowchart of the deactivation process of block 512 is slightly different from the one shown in FIG. 6. The only modification to the flowchart of FIG. 6 is to equate, in block 606, the address to K instead of 0, where K+1 is the number of the first few taps exempt from deactivation.

A fourth embodiment of the present invention uses, as the error metric, the change in the true MSE instead of the true MSE. In other words, the value of {new (true MSE)—old (true MSE)} is computed and used as the error metric. In the fourth embodiment, the first test in block 516 is satisfied if the change in the true MSE is greater than a specified change value (e.g., a value that corresponds to a noise to signal ratio (NSR) change of 1 dB) and the power metric is smaller than the specified maximum power. The second test in block 524 is satisfied if the change in the true MSE is smaller than the specified change value or the power metric is greater than the specified maximum power. For example, if the true MSE is at a value corresponding to a NSR of −25 dB before the tap power regulating process is applied, and if the specified change value corresponds to a NSR change of 1 dB, then the final true MSE will be at a value corresponding a NSR of about −24 dB. This fourth embodiment can be used when there is large external noise that is other than echo or NEXT noise. In such a case, the true MSE is large even before the tap power regulation process is applied. Thus, if the true MSE is used as the error metric, practically no taps will be deactivated, resulting in large power dissipation. In this situation, since the large noise is not caused by the uncancelled echo and NEXT impairments, a large number of taps could be deactivated without causing significant additional degradation to the system performance. The fourth embodiment allow these taps to be deactivated in this situation.

In a fifth embodiment, all of the taps in a filter are initially activated and converged, instead of being activated in blocks and converged in stages as in the first embodiment. The flowchart of the fifth embodiment is similar to the one of the first embodiment shown in FIG. 6, except for the following two differences. The first difference is that, in the activation block 506, the block of taps is set to include all of the taps in the filter. The second difference is that the block 520 is not needed.

In each of the embodiments, there are several ways of computing the error metric. The error metric can be computed as a measurement of system performance degradation caused by the filter being considered, or by the four filters in the constituent transceiver being considered, or by all the 16 filters in the four constituent transceivers of the gigabit transceiver.

When computed as a measurement of degradation caused by all 4 filters of the constituent transceiver being examined, the error metric provides a good indication of the bit error rate of that constituent transceiver.

In the case where the error metric is computed as a measurement of degradation caused by all the 16 filters in the 4 constituent transceivers of the gigabit transceiver, the power regulation process can allow the filters in one of the 4 transceivers to have larger error and compensate for this error in the filters of the other 3 transceivers. For example, if the echo/NEXT impairments in one particular transceiver are very severe and too many active taps would be needed to cancel them, then the power regulation process can allow the impairments to stay severe in this transceiver, and allocate the power resource to the other 3 transceivers instead. It is noted that, in this case, the trellis decoder 38 still decodes correctly since it uses signal samples from all the four transceivers in its decoding scheme.

When applied to the echo and NEXT cancellers of the gigabit transceiver, for typical channels, the power regulation process of the present invention results in a large number of taps being deactivated and the power consumption being reduced by a large factor. Simulation tests confirm this result.

Figure 11:
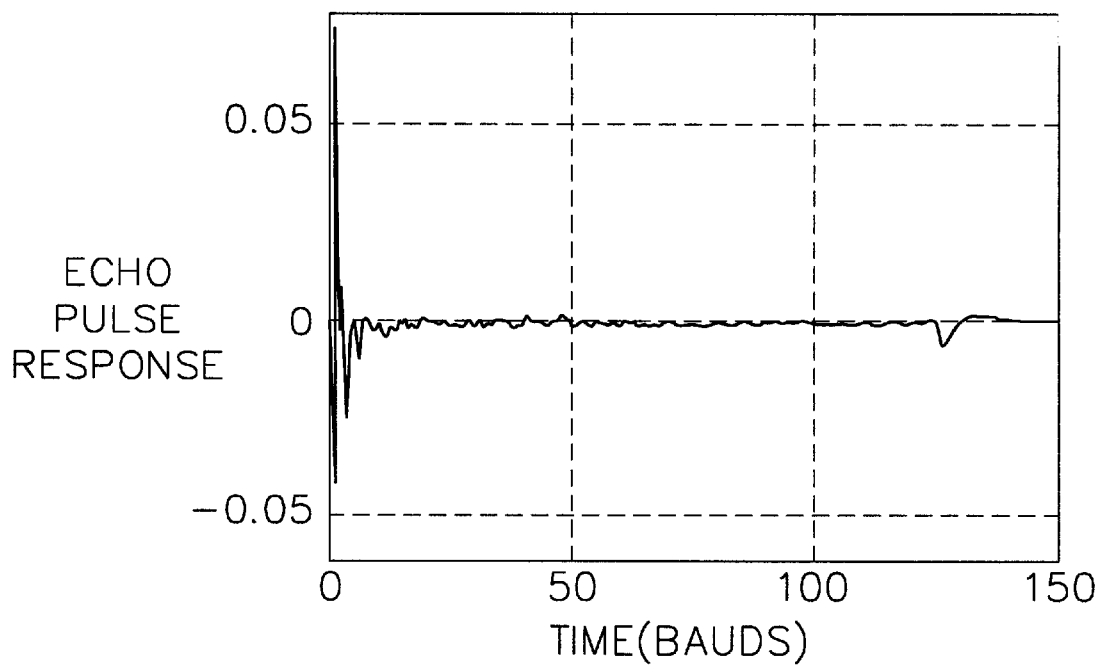
FIG. 11 is a graph of an exemplary impulse response of the echo characteristics of a typical channel.
Figure 12:
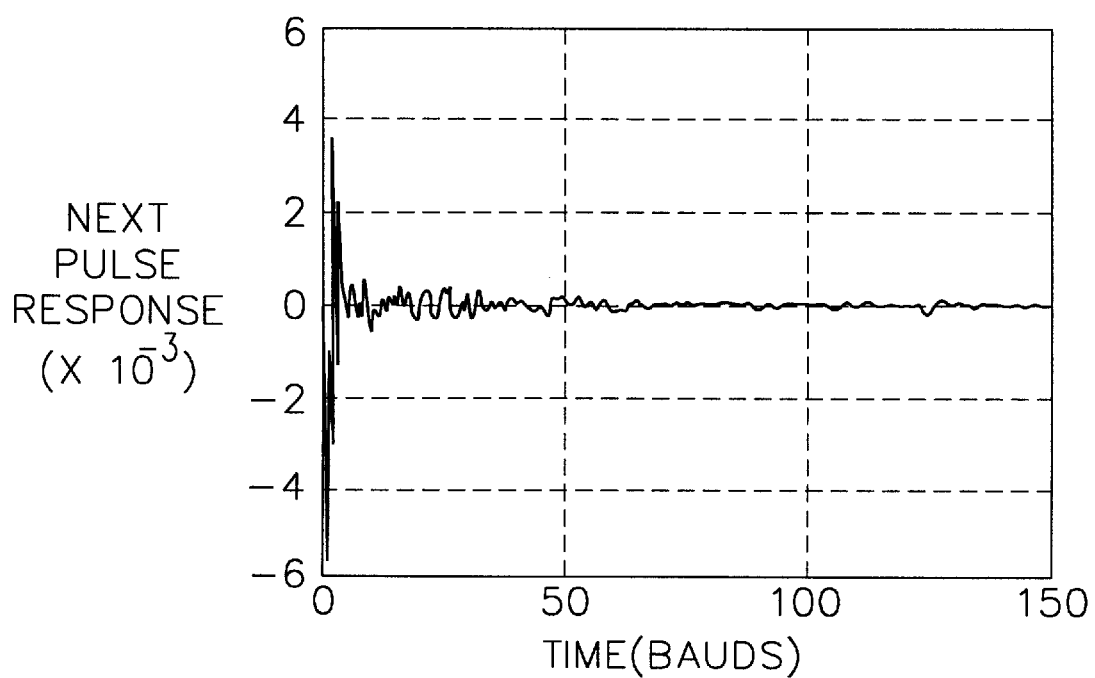
FIG. 12 is a graph of an exemplary impulse response of the near-end crosstalk (NEXT) characteristics of a typical channel.
Figure 13A:
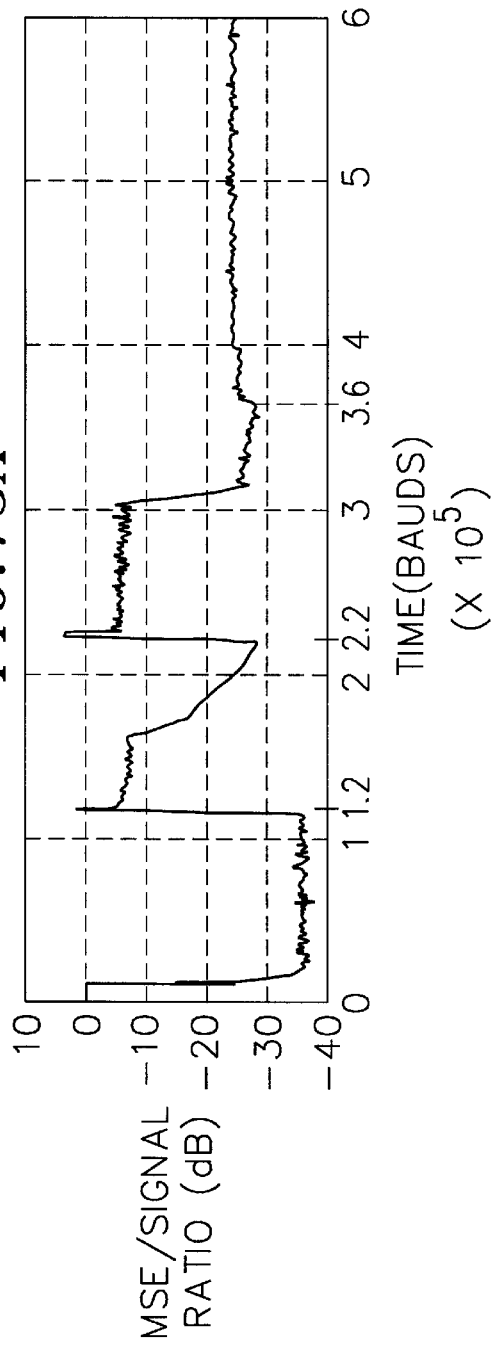
FIGS. 13A and 13B are graphs of the mean squared error to signal ratio (MSE/signal) expressed in dB as a function of time, with time expressed in bauds, of exemplary Master and Slave transceivers, respectively.
Figure 13B:
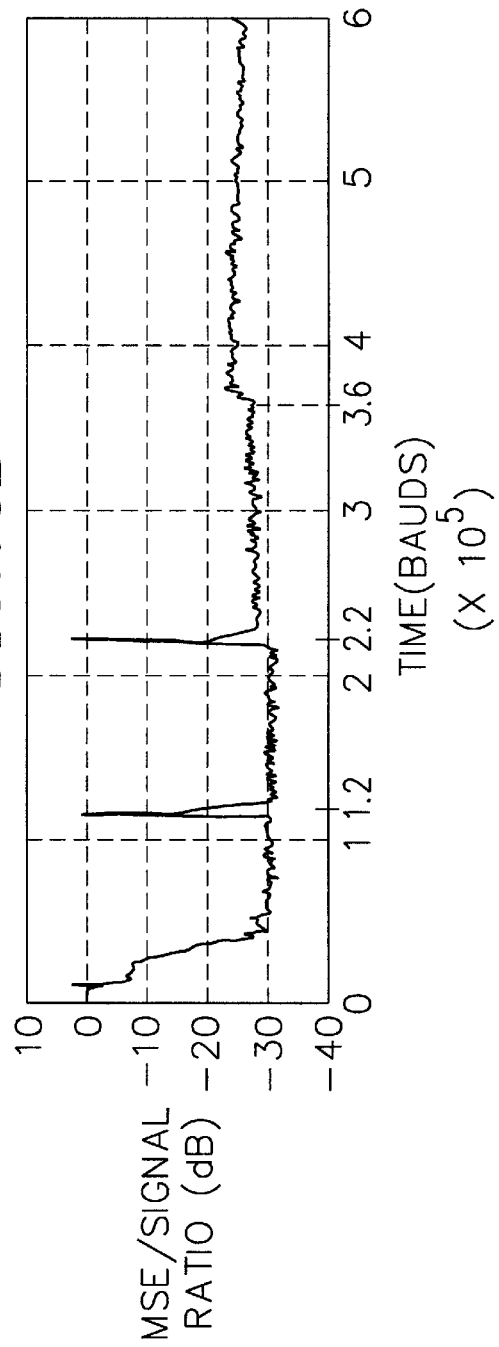

FIG. 11 illustrates an exemplary impulse response of the echo characteristic developed by a typical multi-pair transmission channel in response to a known impulse. FIG. 12 illustrates an exemplary impulse response of the near end crosstalk (NEXT) characteristics developed by a typical transmission channel in response to a similar known impulse. FIGS. 13A and 13B illustrate the results of simulation programming performed to evaluate the application of tap power regulation methodologies to a local constituent transceiver and a remote constituent transceiver connected together through a transmission channel having the echo impulse response of FIG. 11.

During the initial period of communication, through a process known as Auto-Negotiation, the two transceivers negotiate then agree on their respective status as Master and Slave. FIGS. 13A and 13B show the MSE to signal ratio expressed in dB as a function of time, with time expressed in bauds, for the Master and Slave transceivers, respectively. Each point on the graphs in FIGS. 13A and 13B is obtained by averaging the instantaneous measurements taken over 10,000 symbol periods. The error metric MSE is computed based on the error signal 42A (in FIG. 3), i.e., the error as seen by the trellis decoder 38 (FIG. 3).

Referring to FIGS. 13A and 13B, during the time interval from 0 baud to about $1.2 \times 10^5$ bauds, the Master trains its own echo canceller while transmitting with an independent, fixed clock. During this time interval, the Slave synchronizes to the signal transmitted by the Master, and trains its feed-forward equalizer and its timing recovery block. During the time interval from about $1.2 \times 10^5$ bauds to about $2.2 \times 10^5$ bauds, the Slave trains its echo canceller while transmitting. During this time interval, the Master is not transmitting, only receiving from the Slave, and trains its feed-forward equalizer and its timing recovery block to account for the delay in the channel. By the end of this time interval, the Master and Slave are synchronized with each other.

During the time interval from about $2.2 \times 10^5$ bauds to about $3.2 \times 10^5$ bauds, both the Master and Slave transmit and receive. During this time interval, the Master retrains its echo canceller and readjust timing. From about $3.2 \times 10^5$ bauds, there is convergence of both Master and Slave echo cancellers. At about $3.6 \times 10^5$ bauds, the tap power regulating process of the present invention is applied to both echo cancellers, with the specified error, i.e., the maximum acceptable system performance degradation, set at a value corresponding to a NSR of −24 dB. As shown in FIGS. 13A and 13B, for both local and remote transceivers, the MSE increases to and stays at this specified error corresponding to a NSR of −24 dB. In this example, in each constituent transceiver, the echo canceller has initially 140 taps, and each of the three NEXT cancellers has initially 100 taps. The total number of initial taps in each constituent transceiver is 440.

Figure 14A:
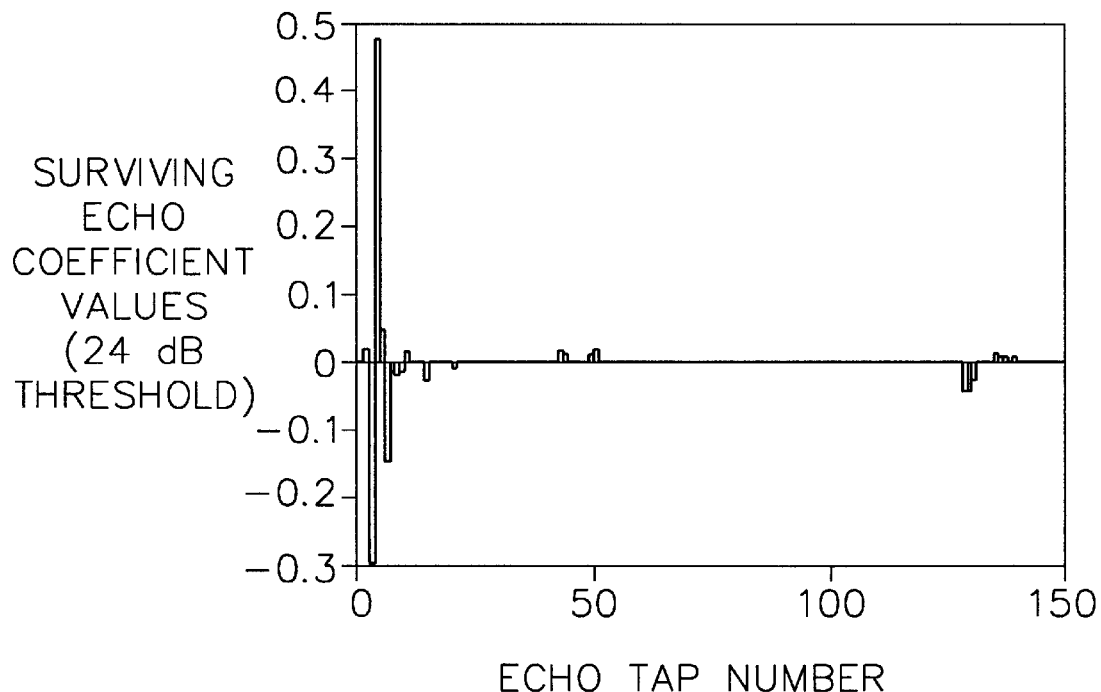
FIGS. 14A and 14B are graphs of the values of the tap coefficients of an exemplary echo canceller as a function of the tap number, after application of the tap power regulating process with the specified error set at −24 dB and −26 dB, respectively.
Figure 14B:
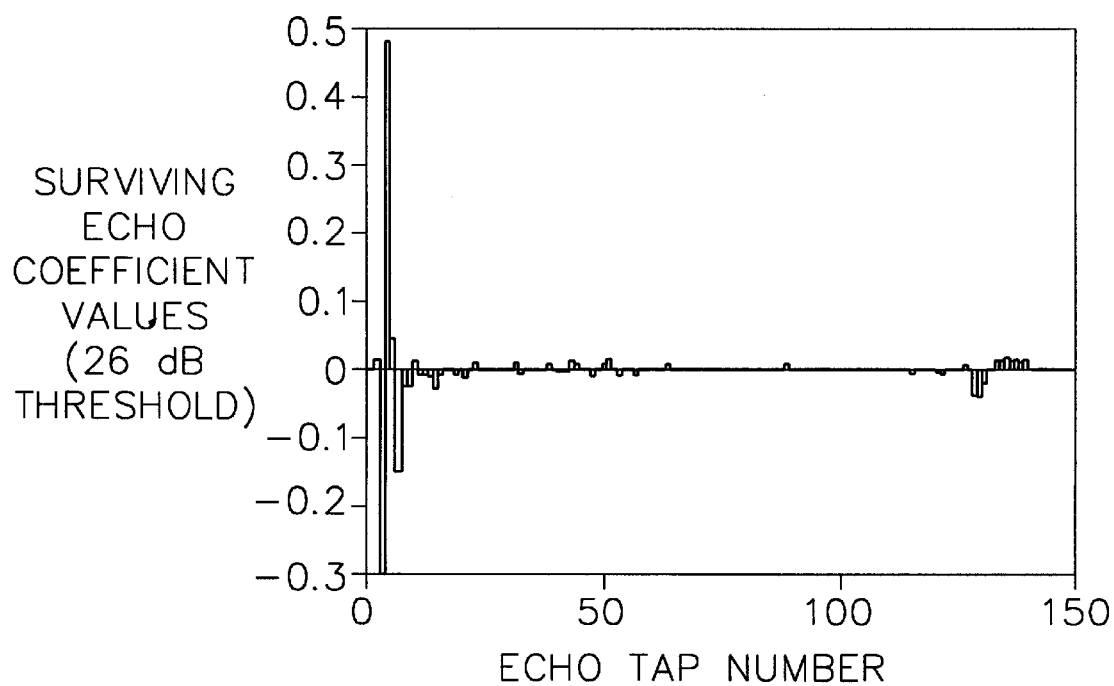

FIGS. 14A and 14B are graphs of the values of the tap coefficients of the echo canceller as a function of the tap number, after application of the tap power regulation process with the specified error set at values corresponding to noise to signal ratio of −24 dB and −26 dB, respectively. The deactivated coefficients are shown as having value zero.

Referring to FIG. 14A, the number of taps remaining active, after application of the tap power regulation process with the specified error corresponding to a NSR of −24 dB, is 22. For this specified error, the remaining active taps for the three NEXT cancellers is 6, 2, and 0, respectively (not illustrated). Thus, out of a total of 440 initially active taps in the constituent transceiver, only 30 remain active after application of the process of the present invention, while a 5 dB margin is maintained for the required bit error rate.

Referring to FIG. 14B, after application of the tap power regulation process with the specified error corresponding to a NSR of −26 dB, the number of taps remaining active is 47. For this specified error, the remaining active taps for the three NEXT cancellers (not illustrated) is 6, 2, and 0, respectively. Thus, out of a total of 440 initially active taps in the constituent transceiver, only 55 remain active after application of the process of the present invention, while a 7 dB margin is maintained for the required bit error rate.

FIGS. 14A and 14B show that the surviving taps occur at sparse locations. This is due to the strong dependence of the echo/NEXT cancellers on the specific cable response. Since the response characteristics of any given cable making up the transmission channel are not a priori determinable, it would be impossible, in practice, to predict and statically allocate the surviving taps during the design of the echo and NEXT cancellers. Therefore, some sort of dynamic active tap identification and allocation process according to the invention offers significant power reduction benefits over conventional methodologies.

While the systems and methods of the invention have been described mainly in terms of their applicability to adaptively configuring active tap sets for high order digital filters, the dynamic power regulation methodology of the present invention can also be applied to complete computation modules of a transceiver, in cases where the computational power of such modules is not needed for a particular application. In these cases, a similar methodology applies, i.e., evaluate a signal performance metric of a signal output from a computational module against a performance threshold and, where the performance metric is greater than the threshold, power down the computational module.

This additional embodiment of the invention is particularly advantageous in cases where the transmission channel might be implemented with short (<3 meters) cable lengths, resulting in the relative absence of transmission channel induced intersymbol interference (ISI). Returning momentarily to the description of the trellis decoder circuit accompanying FIG. 4, in the absence of intersymbol interference, symbols received from the deskew memory 37 need only be decoded by the Viterbi decoder 304, and its associated modules, i.e., the path metrics module 306, and the path memory module 308, without resorting to a decision-feedback sequence estimation approach, as discussed previously. In this case, the dynamic power regulation process reduces the power consumption of the gigabit transceiver by deactivating and bypassing the computational modules represented by the MDFE 302, the DFE 312 and the select logic 310. Since received symbols are relatively uneffected by channel induced ISI, there is no need to develop ISI compensation for incomming signal samples prior to symbol decode, and therefore no need for ISI compensation circuitry.

Figure 15:
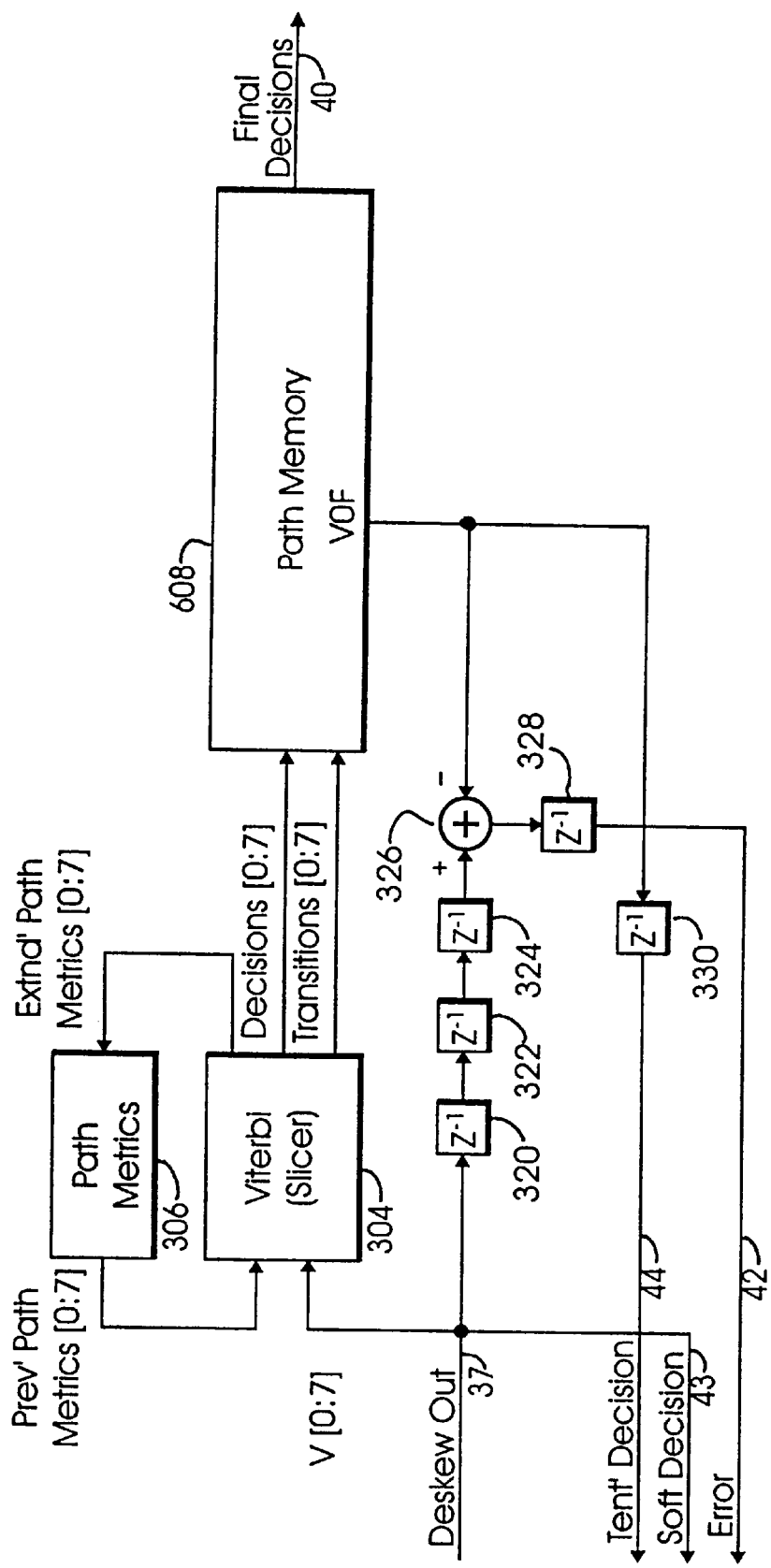
FIG. 15 is a block diagram of an exemplary trellis decoder as applied to a case in which there is substantially no intersymbol interference.

FIG. 15 is a simplified, semi-schematic block diagram of an exemplary trellis decoder 38 as it might be implemented in the case where it has been determined that there is substantially no channel induced intersymbol interference. Referring to FIG. 15, the 4-D output signal 37 from the deskew memory 36 is provided directly to the Viterbi decoder 304, as the Viterbi input. In accordance with the invention, it should be noted that, in the absence of intersymbol interference, only a single 4-D Viterbi input is needed in contrast to the eight state inputs required in the full ISI compensation case.

As illustrated in FIG. 15, the DFE, MDFE and decoder circuitry has been replaced by a series of simple delay stages and an adder circuit, with the deskew output signal (a signal sample) directly input to the Viterbi decoder 304. The deskew output signal sample is also directed through a set of three series coupled sequential delay stages 320, 322 and 324 and then to an adder circuit 326. Signal samples are added to the negative of the first tentative decision $V_{OF}$ output by the path memory module 308 in the adder circuit 326 in order to develop an error term. The error term is directed through an additional delay stage 328 after which the error term 42 might be directed to an adaptive gain stage (34 of FIG. 3) and timing recovery circuit (222 of FIG. 3). In the exemplary embodiment shown in FIG. 15, the 4-D error 42 is computed as the delayed difference between the delayed 4-D input 37 and the 4-D output $V_{OF}$ of the path memory module 308. The corresponding 4-D tentative decision 44 may be represented as nothing more than a delayed version of the 4-D output $V_{OF}$ of the path memory module 308; the delay occuring in an additional delay stage 330. In the embodiment shown in FIG. 15, the error and tentative decision delay elements 328 and 330, respectively, are used to ensure that the error 42 and the tentative decision 44 arrive at the timing recovery block (222 of FIG. 3) at the same time. Depending on the design and implementation of the timing recovery block, these delay elements may not necessarily be needed in alternative embodiments.

Figure 16:
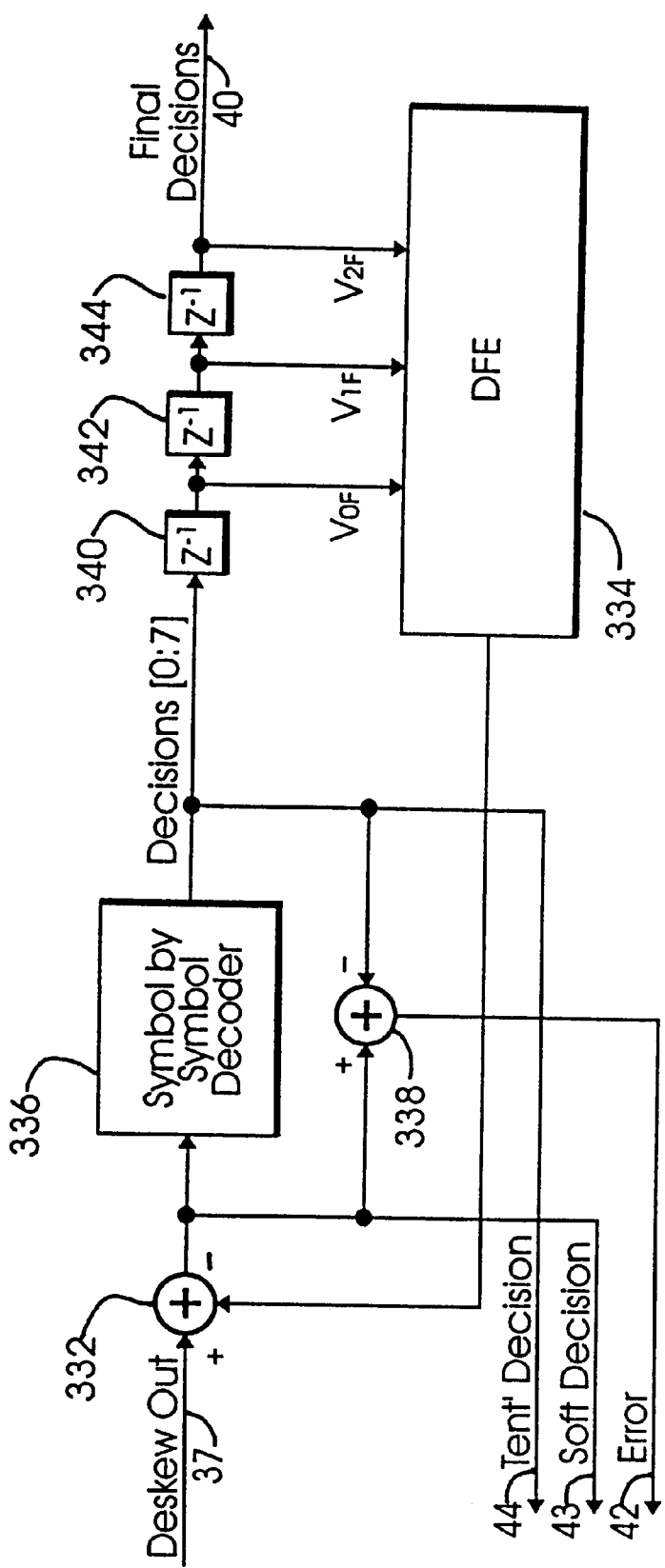
FIG. 16 is a simplified block diagram of an alternative embodiment of the invention in which power consumption is reduced by substitution of a symbol-by-symbol decoder in place of a Viterbi decoder.

FIG. 16 illustrates yet a further embodiment of the invention which is particularly advantageous in situations where the signal-to-noise ratio is very high (as may happen with a short cable, e.g., of less than 50 meters). In such situations, the coding gain provided by the trellis code may not be needed, and adequate system performance, as indicated by the bit error rate, may be achieved without making use of this coding gain. In these situations, substantial power dissipation reductions can be achieved by disabling the trellis decode enabling features of the complex Viterbi decoder, including the Viterbi decoder block 304, its associated path metric and path memory modules 306 and 308, and a large portion of the ISI compensation circuitry including the MDFE 302 and the select logic 310. These portions are replaced, or substituted, with a simple symbol-by-symbol decoder and a simple decision feedback equalizer to detect the received signal, instead of using the computationally complex Viterbi decoder.

Referring to FIG. 16, signal samples output by the deskew memory are directed through an adder circuit 332, which determines the difference between the input signal samples and the 4-D output of a DFE 334. A symbol-by-symbol decoder 336 receives the difference between the 4-D signal samples and the 4-D output from the DFE 334 and decodes it. A 4-D tentative decision 44 is taken directly from the output of the symbol-by-symbol decoder 336, and an error term 42 is developed by an additional adder circuit 338, coupled to define the difference between the input and the output of the symbol-by-symbol decoder 336. A soft decision 43, which is used for display purposes only, is taken directly from the input of the symbol-by-symbol decoder 336.

Final decisions are developed by delaying the output of the symbol-by-symbol decoder through three series coupled sequential delay stages 340, 342 and 344. The output of each respective delay stage is directed to the DFE as a corresponding tentative decision $V_{OF}$, $V_{1F}$ and $V_{2F}$.

In each of the cases described in connection with FIGS. 15 and 16, it will be understood that the surviving elements of the decoder section are all present in a fully functional Viterbi decoder system with ISI compensation. Such a system is described in co-pending U.S. patent application entitled System and Method for High-Speed Decoding and ISI Compensation in a Multi-Pair Transceiver System, filed on instant date herewith and commonly owned by the assignee of the present invention, the entire contents of which are expressly incorporated by reference. As decisions are made with regard to the desirability of maintaining the circuitry in a fully operational condition or truncating certain computational sections in an effort to reduce power dissipation, the system need only remove power from certain identified portions of the circuitry, with other identified portions allowed to remain powered-up in the active signal path. No additional component circuit elements need be provided.

The dynamic power regulation methodology of the present invention can also be applied to any other component module of a communication system, so long as that module is able to provide a given minimal level of performance with a truncated functional representation or with truncated circuitry. Of course, such minimal performance levels will obtain in only certain situations and are dependent on external factors, particularly the transmission channel characteristics. However, these situations frequently appear in a substantial number of applications or installations. An integrated circuit transceiver capable of adaptively configuring itself to provide a "just sufficient" level of performance while operating at the lowest obtainable power dissipation levels would lend itself to almost universal application.

While certain exemplary embodiments have been described in detail and shown in the accompanying drawings, it is to be understood that such embodiments are merely illustrative of and not restrictive on the broad invention. It will thus be recognized that various modifications may be made to the illustrated and other embodiments of the invention described above, without departing from the broad inventive scope thereof. It will be understood, therefore, that the invention is not limited to the particular embodiments or arrangements disclosed, but is rather intended to cover any changes, adaptations or modifications which are within the scope and spirit of the invention as defined by the appended claims.

What is claimed is:

1. A method for dynamically regulating power consumption of a communication system including a first module, the method comprising the operations of:

specifying at least one of a specified power and a specified error;

computing at least one of an information error metric and a power metric; and controlling activation and deactivation of at least a portion of the first module of the communication system according to a criterion, the criterion being based on at least one of the information error metric, the power metric, the specified error and the specified power, to regulate at least one of the information error metric and the power metric;

wherein the criterion is the following:

activate if the information error metric is strictly greater than the specified error and the power metric is strictly smaller than the specified power; and deactivate if the information error metric is strictly smaller than the specified error or the power metric is strictly greater than the specified power.

2. A method for dynamically regulating power consumption of a communication system including a first module, the method comprising the operations of:

specifying at least one of a specified power and a specified error;

computing at least one of an information error metric and a power metric; and controlling activation and deactivation of at least a portion of the first module of the communication system according to a criterion, the criterion being based on at least one of the information error metric, the power metric, the specified error and the specified power, to regulate at least one of the information error metric and the power metric;

wherein the criterion is the following:

activate if the information error metric is greater than the specified error and the power metric is strictly smaller than the specified power; and deactivate if the information error metric is smaller than a target value, the target value being smaller than the specified error, or the power metric is strictly greater than the specified power.

3. A method for dynamically regulating power consumption of a high-speed integrated circuit including a multiplicity of processing blocks, the method comprising the operations of:

defining a first metric relating to a first performance parameter of the integrated circuit;

defining a second metric relating to a second performance parameter of the integrated circuit;

setting the first metric to a pre-defined value;

disabling selected ones of the multiplicity of processing blocks in accordance with a set of pre-determined patterns;

evaluating the second metric, while performing the disabling operation, to generate a range of values of the second metric, each of said values corresponding to the pre-defined value of the first metric;

identifying a most desirable value of the second metric from the range of said values; and matching the most desirable value of the second metric to a corresponding one of the pre-determined patterns;

wherein the integrated circuit is subsequently operated with selected ones of the multiplicity of processing blocks disabled in accordance with the pre-determined pattern corresponding to the most desirable value of the second metric.

4. The method of claim 3, wherein the first and second performance parameters are distinct and are chosen from the parametric group consisting of power consumption and a signal quality figure of merit.

5. The method of claim 4 wherein the integrated circuit is a bidirectional communication device and wherein the multiplicity of processing blocks comprises multi-tap digital filter elements, wherein the disabling operation comprises the operation of adaptively disabling taps of one of the multi-tap digital filter elements.

6. The method of claim 4, wherein the integrated circuit is a bidirectional communication device and wherein the multiplicity of processing blocks comprises a decoder, including at least a symbol-by-symbol decoder and a trellis decoder, wherein the disabling operation comprises the operation of disabling the trellis decoder.

* * * * *